(12) United States Patent
Roberts et al.

(10) Patent No.: US 12,494,789 B2
(45) Date of Patent: Dec. 9, 2025

(54) DETERMINING A LOCKED STATUS OF A CLOCK TRACKING CIRCUIT

(71) Applicant: Microchip Technology Incorporated, Chandler, AZ (US)

(72) Inventors: William Roberts, Highland, UT (US); Waleed El-halwagy, Ottawa (CA); Youcef Fouzar, Ottawa (CA); Kristopher Kshonze, Ottawa (CA)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 18/465,887

(22) Filed: Sep. 12, 2023

(65) Prior Publication Data

US 2024/0088904 A1 Mar. 14, 2024

Related U.S. Application Data

(60) Provisional application No. 63/375,348, filed on Sep. 12, 2022, provisional application No. 63/375,351, filed on Sep. 12, 2022.

(51) Int. Cl.
*H03L 7/091* (2006.01)
*H03L 7/087* (2006.01)
*H03L 7/093* (2006.01)
*H03L 7/095* (2006.01)

(52) U.S. Cl.
CPC .............. *H03L 7/091* (2013.01); *H03L 7/087* (2013.01); *H03L 7/093* (2013.01); *H03L 7/095* (2013.01)

(58) Field of Classification Search
CPC ......... H03L 7/091; H03L 7/087; H03L 7/093; H03L 7/095
See application file for complete search history.

(56) References Cited

U.S. PATENT DOCUMENTS

| | | |
|---|---|---|
| 5,870,002 A | 2/1999 | Ghaderi et al. |
| 7,428,284 B2 | 9/2008 | Lin |
| 2003/0016087 A1 | 1/2003 | Yamane et al. |
| 2007/0090887 A1* | 4/2007 | Seefeldt ............... H03D 13/004 331/17 |
| 2008/0084233 A1 | 4/2008 | Lee |
| 2010/0061499 A1 | 3/2010 | Mijuskovic |

(Continued)

FOREIGN PATENT DOCUMENTS

CN 108712168 A 10/2018

OTHER PUBLICATIONS

International Search Report of International Application No. PCT/US2023/074003, mailed Jan. 22, 2024, 6 pages.

(Continued)

*Primary Examiner* — Janice N Tieu
(74) *Attorney, Agent, or Firm* — TraskBritt

(57) ABSTRACT

An example apparatus includes a phase detector, a digital discriminator, and a logic circuit. A status signal of the phase detector is at least partially based on a phase relationship between a reference clock and a feedback clock, the feedback clock generated by a clock tracking circuit to track the reference clock. The digital discriminator may sample the status signal of the phase detector. The logic circuit may determine a locked status of the clock tracking circuit at least partially based on samples of the status signal of the phase detector.

21 Claims, 29 Drawing Sheets

(56) References Cited

U.S. PATENT DOCUMENTS

| | | | |
|---|---|---|---|
| 2010/0231789 A1* | 9/2010 | Nakamuta | H03L 7/104 |
| | | | 348/E5.009 |
| 2011/0227616 A1 | 9/2011 | Jang et al. | |
| 2018/0183643 A1* | 6/2018 | Kang | H04L 25/0226 |
| 2020/0162081 A1 | 5/2020 | Jayakumar et al. | |

OTHER PUBLICATIONS

International Search Report of International Application No. PCT/US2023/074006, mailed Jan. 22, 2024, 6 pages.

Li, Chung-Yi, Fast locking adaptive PFF using Dual-Edge Phase-Frequency Detector, Microelectronics Journal 46, (2015), pp. 1413-1419.

Written Opinion of the International Searching Authority of International Application No. PCT/US2023/074003, mailed Jan. 22, 2024, 16 pages.

Written Opinion of the International Searching Authority of International Application No. PCT/US2023/074006, mailed Jan. 22, 2024, 10 pages.

* cited by examiner

FIG. 14 (STATE OF THE ART)

(STATE OF THE ART)

FIG. 17

DETERMINING A LOCKED STATUS OF A CLOCK TRACKING CIRCUIT

CROSS-REFERENCE TO RELATED APPLICATIONS

This application claims the benefit under 35 U.S.C. § 119(e) of the priority date of U.S. Provisional patent application Ser. No. 63/375,351 filed Sep. 12, 2022, for "DUAL EDGE PFD WITH DYNAMIC DOUBLING AND EDGE LOCKING CLARITY," and claims the benefit under 35 U.S.C. § 119(e) of the priority date of U.S. Provisional Patent Application Ser. No. 63/375,348 filed Sep. 12, 2022, for "PLL PHASE ERROR BASED DIGITAL LOCK DETECTION," the contents and disclosure of which are incorporated herein in their entirety by this reference.

FIELD

One or more examples relate, generally, to error detection, including phase and frequency error detection. One or more examples relate, generally, to determining a locked status of a clock tracking circuit.

BACKGROUND

Clock-tracking circuits such as phase locked loops and delay locked loops, are circuits utilized to generate a signal with a pre-determined relationship to a clock and other oscillating signal. An output signal of a clock-tracking circuit is locked to the phase and frequency of a reference signal. Clock-tracking circuits are utilized in a variety of operational contexts, including when two signals having known relationships are utilized to transmit information.

BRIEF DESCRIPTION OF THE DRAWINGS

To easily identify the discussion of any particular element or act, the most significant digit or digits in a reference number refer to the figure number in which that element is first introduced.

FIG. 17 is a block diagram depicting an apparatus that provides single and dual-edge phase error detection, in accordance with one or more examples.

DETAILED DESCRIPTION

Figure 1:
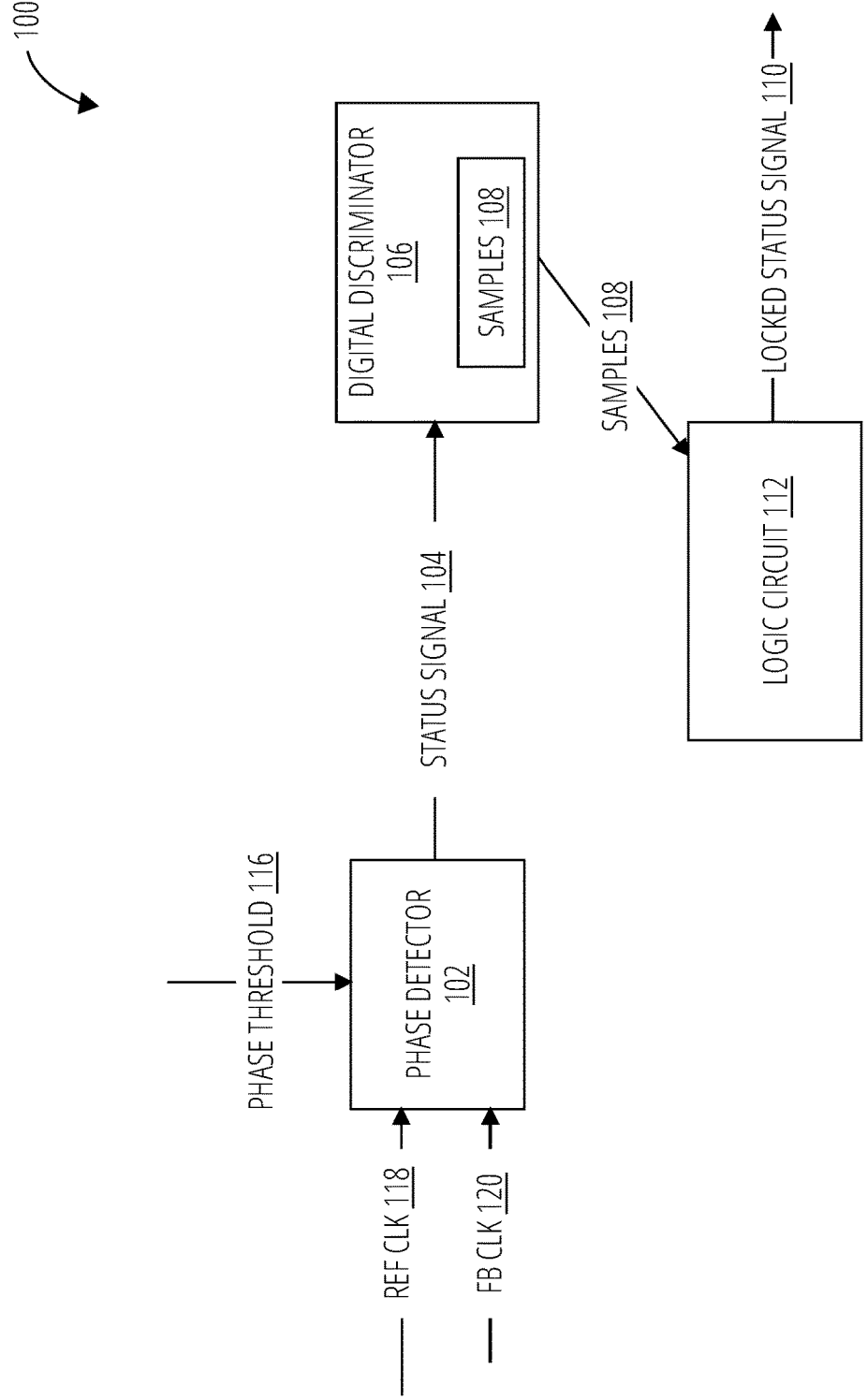
FIG. 1 is a block diagram of an apparatus for determining a locked status of a clock tracking circuit, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer executes computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, without limitation. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, any relational term, such as "over," "under," "on," "underlying," "upper," "lower," without limitation, is used for clarity and convenience in understanding the disclosure and accompanying drawings and does not connote or depend on any specific preference, orientation, or order, except where the context clearly indicates otherwise.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

As used herein, the term "assert" when used with "signal" means to set a signal to an active state. As used herein, the term "de-assert" when used with "signal" means to set a signal to an inactive or default state. For example, signals may be active high and inactive low, or active low and inactive high.

A "clock signal" or just a "clock," is a signal that oscillates between two discrete state—a low state and a high state—in a reliably predictable manner. The change from a low state to a high state or a high state to a low state is referred to as an "edge." The type or direction of a change, low state to high state or high state to low state, is referred to as the "polarity" of the edge. A change from low state to high state is called a "positive polarity" or a "rising edge." A change from high state to low state is called a "negative polarity" or a "falling edge." One or more circuits may be responsive to a rising edge or falling edge of a clock, as a non-limiting example, to coordinate acts.

A clock tracking circuit, such as a phase locked loop (PLL), without limitation, generates an output signal exhibiting a phase, frequency, or both having a predetermined relationship to a phase or frequency of a reference signal. Causing and maintaining such a predetermined relationship between the phase or frequency of an output signal and a reference signal is referred to herein as "tracking." The predetermined relationship may be that the output signal and reference signal are in-phase or within some predetermined phase difference. The predetermined relationship may be that the frequency of the output signal is the same as, or a multiple of, a frequency of the reference signal. As a non-limiting example, the frequency of the output signal may be an integer or fractional multiple of the frequency of the reference signal, such as 1/200, 1/10, 10, or 200 times the frequency of the reference signal.

A typical clock tracking circuit includes an electronic oscillator that the clock tracking circuit controls to generate an output signal that tracks the reference signal. An electronic oscillator may include one or more banks of control elements (e.g., capacitors, inductors, delay circuits, without limitation) that are voltage controlled, current controlled, digitally controlled, or a combination or sub-combination thereof. Enabling and disabling respective control elements changes the capacitance, inductance, or delay, as the case may be, of the electronic oscillator in a predictable manner, which changes the output phase and frequency of the electronic oscillator in a predictable manner.

An electronic oscillator may include multiple inputs for controlling (enabling/disabling) various banks of control elements and, accordingly, governing the phase and frequency of an output signal. Non-limiting examples of electronic oscillators include a voltage controlled oscillator (VCO) that generates an output signal exhibiting a phase or frequency governed by a voltage of a control signal, a current controlled oscillator (CCO) that generates an output signal exhibiting a phase or frequency governed by a current of a control signal, a digitally controlled oscillator (DCO) that generates an output signal exhibiting a phase or frequency governed, at least in part, by a value of a control code, and combinations/subcombinations thereof.

When a clock tracking circuit reliably tracks an output signal to a reference signal, that is referred to as "locked" or being in a "locked state." Being locked is also referred to as a "NULL condition" 'because the phase error is zero or suitably small or "NULL." When locked, if the phase or frequency of a reference signal changes, the clock tracking circuit correspondingly adjusts the phase or frequency of the output signal to maintain the predetermined relationship. Similarly, when locked, if the phase or frequency of the output signal changes, the clock tracking circuit correspondingly adjusts the phase or frequency of the output signal to maintain the predetermined relationship. An internal signal is generated at the clock tracking circuit to indicate locked state. Such a locked state signal may be utilized, as a non-limiting example, to enable output drivers and to initiate other clock tracking calibration functions.

The threshold for determining a locked state (i.e., the thresholds for determining that an output signal is operating in a stable defined range, without limitation) depends, as a non-limiting example, on specific operating conditions. For example, some applications may tolerate less accuracy (i.e., greater difference) between the target frequency and the output frequency, while others will not tolerate it.

Sometimes analog control signals to the electronic oscillator (e.g., to an analog proportional input of the electronic oscillator, without limitation) are used to determine a locked status. Whether or not the output signal is operating in a stable, defined range may be inferred based on the control signals. The inventors of this disclosure appreciate that such an approach requires analog references and comparators targeted at the clock tracking circuits specific operating points that define its stable, defined range, and analog components require a lot of real estate compared to digital components. Further, while analog control signals may be generated based on phase error, they do not directly include phase error information. Locked status is either deduced, which may be imprecise or wholly inaccurate, or determined using control signals, which are an imperfect representation of the phase error, in either case, locked status determinations are subject to error.

One or more examples relate to a locked status detector for a clock tracking circuit. In some examples, the locked status detector determines locked status at least partially based on the reference clock and feedback clock, an UP signal and DOWN signal generated by a binary error detector (e.g., by a phase-frequency detector, without limitation), or both.

In one or more examples, the locked status detector includes a phase detector with a phase threshold and a status signal. The phase threshold is settable. The phase detector compares the phase difference between two input signals (e.g., a reference clock and a feedback clock, without limitation) to the phase threshold. If the phase difference between the two input signals is greater than or equal to the phase threshold, the phase detector sets its output to a first value. If the phase difference between the two input signals is less than the phase threshold the phase detector sets its status signal to a second value, the second value different than the first value. The value of the status signal of the phase detector indicates the relationship between phase difference and phase threshold. The first value indicates the phase difference between the two input signals is greater than or equal to the phase threshold and that one of the input signals (e.g., a feedback clock, without limitation) is operating outside the phase detector's set dead-zone. The second value indicates the phase difference between the two input signals is less than the phase threshold and that one of the input signals (e.g., a feedback clock, without limitation) is operating within the phase detector's set dead-zone.

The term "dead-zone" typically refers to an operating region in which a phase detector (or the phase detector output—the error signal) exhibits zero or near zero gain (e.g., here, gain refers to the magnitude of the error signal) because the phase difference between two input signals is zero or near zero. In one or more examples, a phase detector has a "set dead-zone." The set dead-zone is set via the phase threshold. In one or more examples, a phase error region associated with a set dead-zone may be the same or different than a phase error region associated with an actual dead-zone of the phase error detector.

The status signal may change from indicating outside to indicating within the dead-zone in response to a changing phase difference between input signals. The status signal may change from indicating within to indicating outside the set dead-zone in response to a changing phase difference between input signals. In the context of locked status detection, the set dead-zone corresponds to a predetermined range of phase error pre-associated with a locked state.

The phase threshold of the phase detector may be settable (e.g., programmable, configurable, or otherwise settable, without limitation), and so the phase detector is adaptive or adaptable, as the case may be, to operating conditions at least partially based on the phase threshold. In one or more examples, the phase threshold may be pre-set or set in real-time.

In one or more examples, the status signal of the phase detector is sampled and the status signal samples are decoded to determine the locked status. In one or more examples, a digital discriminator discriminates between steady-state phase error information and transitory phase error information in the status signal. Steady-state phase error is the phase error present when a clock tracking circuit is locked. Transitory phase error is phase error that is temporary in nature and may or may not be present at any given time. Generally speaking, information about steady-state phase error should be used to determine locked status, while information about transitory phase error should be reduced or eliminated in such a determination.

In one or more examples, the digital discriminator is a digital filter that keeps or passes digital signals (e.g., in the status signal, without limitation) that are indicative of steady-state phase error and blocks or discards digital signals (e.g., in the status signal, without limitation) that are indicative of transitory phase error. In one or more examples, the digital discriminator is a state-machine that implements a pattern-matcher that does bit-wise comparison of a digital signal and predetermined patterns indicative of the locked status of the phase detector. In one or more examples, the digital discriminator is an accumulator and a comparator, and the accumulator accumulates the state of the status signal and the comparator detects when the accumulated state is above a predetermined threshold indicative of a steady-state phase error. The output of the comparator is used as the locked status signal.

A status signal sample is a value of the status signal at a specific interval, i.e., a discrete time, discrete value signal. Notably, the status signal of the phase detector may be a digital signal, which is a discrete time, discrete value signal. So, the status signal may be a series of samples received, as a non-limiting example, in a shift-register. In one or more examples, a sample rate may be set to ensure a set of samples obtained is representative of the phase detector's state. Generally speaking, the higher the sample rate, the greater the number of status signal samples, and the more representative of the phase detector's state.

FIG. 1 is a block diagram of an apparatus 100 for determining a locked status of a clock tracking circuit, in accordance with one or more examples. Apparatus 100 may also be referred to as a "locked status detector 100."

Apparatus 100 includes a phase detector 102, a digital discriminator 106, and a logic circuit 112.

Apparatus 100 receives a reference clock 118, a feedback clock 120, a phase threshold 116, and generates a locked status signal 110 at least partially responsive thereto. Feedback clock 120 is generated by a clock tracking circuit to track the reference clock 118. Reference clock 118 represents the target frequency and phase that the clock tracking circuit tracks. In one or more examples, feedback clock 120 may be derived from an output clock, generated by the clock tracking circuit to track reference clock 118 and fed back, optionally through a frequency divider, for comparison with the reference clock 118. Feedback clock 120 may be the same as the output clock generated by the clock tracking circuit (e.g., the output clock is fed directly to an input of phase detector 102, without limitation) or may be indicative of one or more of the phase, frequency, or pulse width of output clock. In the specific non-limiting examples depicted by FIG. 1, reference clock 118 and feedback clock 120 are fed directly to inputs of phase detector 102. In one or more examples, one or more signals indicative of a phase relationship between reference clock 118 and feedback clock 120 may be fed to one or more inputs of phase detector 102, such as the output of a binary phase detector (such as a bang-bang phase detector, without limitation), the output of a digital or analog sub-sampling phase detector, the output of a digital or analog sampling phase detector, without limitation.

Phase threshold 116 is a value, or a range of values, predetermined to represent the threshold of a set dead-zone at phase threshold 116, and in the context of locked status detection, it also represents an amount of phase error pre-associated with a locked state.

Phase threshold 116 is utilized by phase detector 102 to determine a state of the phase error between reference clock 118 and feedback clock 120. If the phase error is greater than or equal to phase threshold 116 that indicates the phase error is outside the range associated with a locked state, and if the phase error is less than phase threshold 116 that indicates the phase error is within the range associated with a locked state. As a non-limiting example, if phase threshold 116 is set (e.g., by a logic circuit or user, without limitation) to ±5 degrees, then as long as the phase difference between feedback clock 120 and reference clock 118 is within +5 to −5 degrees, apparatus 100 considers the phase-error within the range associated with a locked state.

Locked status signal 110 indicates the locked status of a clock tracking circuit, i.e., indicates whether or not the clock tracking circuit is in a locked state. In one or more examples, a first value of locked status signal 110 indicates the clock tracking circuit is not in a locked state, and a second value of locked status signal 110 indicates the clock tracking circuit is in the locked state. The first value and the second value of locked status signal 110 are different.

Phase detector 102 receives reference clock 118, feedback clock 120 and phase threshold 116 and generates status signal 104 at least partially responsive thereto. Status signal 104 indicates whether or not the feedback clock 120 is operating in the set dead-zone of phase detector 102, as discussed below.

Phase detector 102 determines whether a phase difference between reference clock 118 and feedback clock 120 and is less than phase threshold 116. If phase detector 102 determines that the phase difference is less than phase threshold 116, then feedback clock 120 is determined to be operating within the set dead-zone and phase detector 102 sets status signal 104 to a value that indicates that feedback clock 120 is operating within the set dead-zone of phase detector 102. If phase detector 102 determines that the phase difference is greater than or equal to phase threshold 116, then feedback clock 120 is determined to be operating outside the set dead-zone and phase detector 102 sets status signal 104 to a value that indicates that feedback clock 120 is operating outside the set dead-zone of phase detector 102. Since feedback clock 120 is based on the output clock of the clock tracking circuit, a determination whether or not feedback clock 120 is operating within the set dead-zone is also a determination whether or not the output signal is operating within the set dead-zone.

Phase detector 102 may change the value of status signal 104 from a value indicating outside the set dead-zone to a value indicating within the set dead-zone in response to a changing phase difference between reference clock 118 and feedback clock 120. Phase detector 102 may change the value of status signal 104 from a value indicating within the set dead-zone to a value indicating outside the set dead-zone in response to a changing phase difference between reference clock 118 and feedback clock 120. Thus, the state of status signal 104 may change over time at least partially responsive to changes in the phase difference between reference clock 118 and feedback clock 120.

A value of phase threshold 116 may be predetermined at least partially based on an acceptable amount of phase difference for determining a locked state. The value of status signal 104 is at least partially based on whether or not a phase difference of reference clock 118 and feedback clock 120 is less than phase threshold 116, so status signal 104 is indicative of a locked status of the clock tracking circuit. Stated another way, information about the phase difference between feedback clock 120 and reference clock 118 and locked status of a clock tracking circuit is included in status signal 104. Status signal 104 includes information about the steady-state phase error between feedback clock 120 and reference clock 118, and the locked status of the clock tracking circuit may be determined from the steady-state phase error information. Thus, in one or more examples, a state of status signal 104 may be decoded to determine a locked status of the clock tracking circuit, as described below.

Digital discriminator 106 receives status signal 104 and processes status signal 104 to produce samples 108 of status signal 104. Digital discriminator 106 distinguishes between steady-state phase error information and transitory phase error information in the status signal 104. Digital discriminator 106 stores samples 108 of status signal 104 that include the steady-state phase information.

Logic circuit 112 processes samples 108 to determine patterns indicative of locked status in the stated information about phase detector 102 included in the set of samples 108. Logic circuit 112 determines the locked status of the clock tracking circuit of reference clock 118 and feedback clock 120. If logic circuit 112 determines that the locked status is in a locked state, then it sets locked status signal 110 to a value indicative of a locked state. If logic circuit 112 determines that the locked status is not in a locked state, then it sets locked status signal 110 to a value indicative of not being in a locked state.

The status signal 104 and status signal samples 108 include steady-state phase error information that logic circuit 112 uses to determine (e.g., infer, without limitation) the locked status of the clock tracking circuit. Phase detector 102 changes the state of status signal 104 in a predictable manner so that the state information may be utilized to determine locked status.

Figure 2:
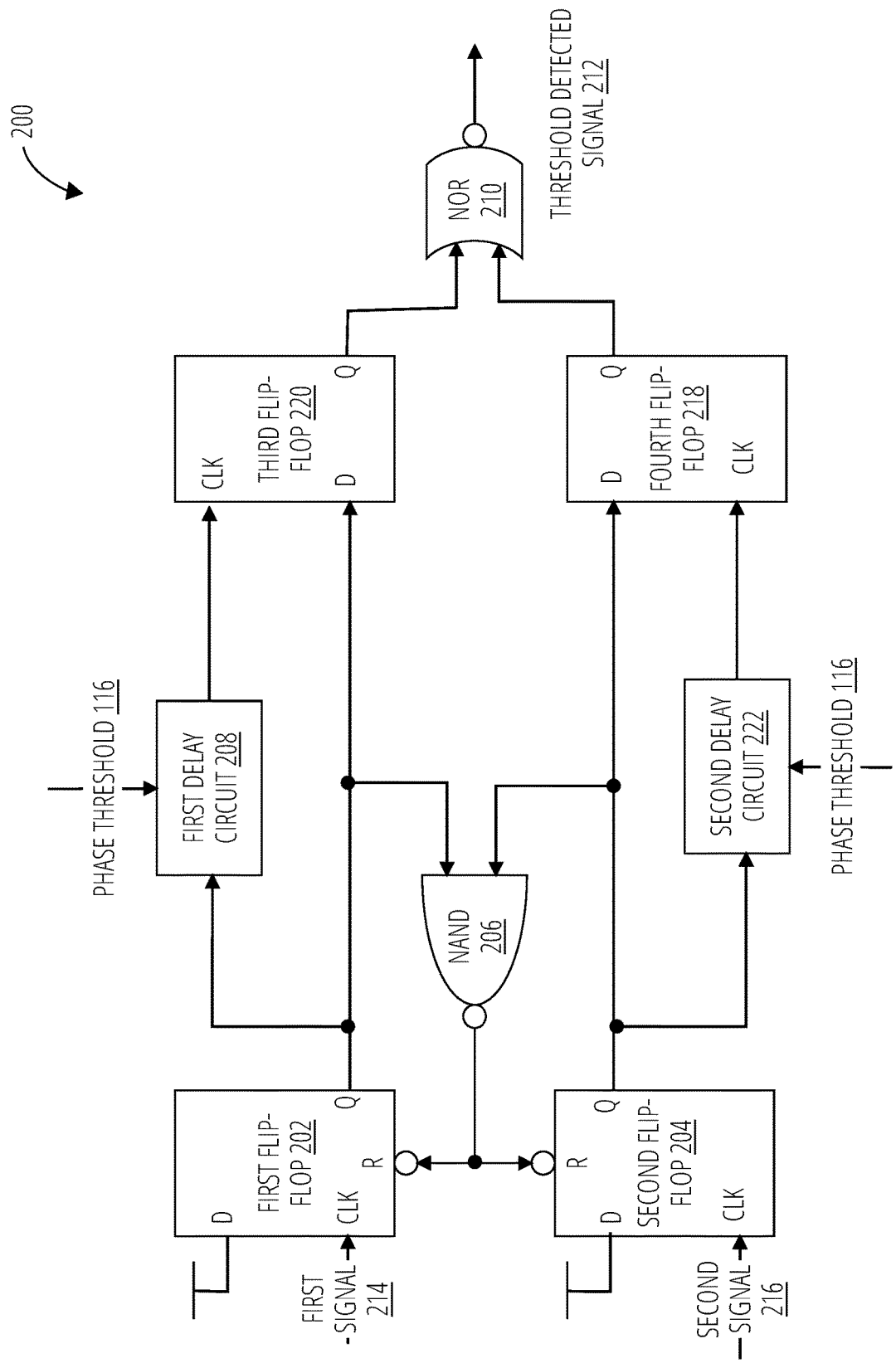
FIG. 2 is a block diagram depicting an apparatus for phase threshold detection, in accordance with one or more examples.

FIG. 2 is a block diagram depicting an apparatus 200 that is an example of a phase detector, in accordance with one or more examples. Apparatus 200 may also be referred to herein as "phase detector 200." Apparatus 200 is a non-limiting example of phase detector 102 of FIG. 1.

Generally speaking, if both input signals exhibit a transition from a low state to high state (rising edge) within a predetermined range then apparatus 100 asserts threshold detected signal 212, and if both input signals do not exhibit a rising edge within the predetermined range, then apparatus 100 de-asserts threshold detected signal 212. Apparatus 200 performs a binary check, either the phase relationship is within the predetermined range, or it is not.

In one or more examples, threshold detected signal 212 may be used as status signal 104. When the rising edge of both signals have arrived, the phase detector re-arms for the next comparison. Stated another way, apparatus 200 sets threshold detected signal 212 to an asserted (high) state in response to determining that a time difference between an occurrence of a rising edge of first signal 214 and an occurrence of a rising edge of second signal 216 is less than phase threshold 116, and sets threshold detected signal 212 to a de-asserted (low) state in response to determining that the time difference between an occurrence of the rising edge of first signal 214 and an occurrence of the rising edge of second signal 216 is greater than phase threshold 116.

Apparatus 200 includes a first flip-flop 202, a second flip-flop 204, a third flip-flop 220, a fourth flip-flop 218, a first delay circuit 208, a second delay circuit 222, a NAND gate 206, and a NOR gate 210.

First flip-flop 202, second flip-flop 204, third flip-flop 220, and fourth flip-flop 218 are edge-triggered flip-flops, which is a type of flip-flop that responds to the change (or "edge") of its clock input rather than the level of the clock input. Each flip-flop 202, 204, 220, and 224 has a Data (D) input, a clock (CLK) input and an output (Q). The state at data (D) input is captured and transferred to the output (Q) in response to the state at clock (CLK) input experiencing a specified edge transition (either rising or falling, but in this example a rising edge). When the clock (CLK) input experiences an edge transition other than the specified edge transition the state at data (D) input is not captured or transferred, and the state at output (Q) is the state at the data (D) input the last time a specified edge transition occurred at the clock (CLK) input.

In one or more examples, the flip-flops may have a single output, Q, capable of exhibiting at least two states, or, alternatively, two separate outputs, Q and Q', that respectively represent one of the two states.

NAND gate 206 is an electronic logic gate that produces an output which is false only when all of its inputs are true. In other words, if any of its inputs are in a low state, then the output will be high state. NOR gate 210 is an electronic logic gate that produces an output which is true only when all of its inputs are false. In other words, if any of its inputs are true, then the output will be false.

First delay circuit 208 and second delay circuit 222 are delay circuits that introduce a respective predetermined amount of time delay to the propagation of a signal from its input to its output. In one or more examples, the respective predetermined amount of time delay introduced is equal to, or at least partially based on, phase threshold 116. In one or more examples, first delay circuit 208 and second delay circuit are programmable, wherein the amount of delay varies partially based on phase threshold 116.

Respective data (D) inputs of first flip-flop 202 and second flip-flop 204 are coupled to a supply voltage to set the data (D) inputs to a high state. The clock (CLK) input of first flip-flop 202 is coupled to receive a first signal 214 and the clock (CLK) input of second flip-flop 204 is coupled to receive a second signal 216. In one or more examples, one of first signal 214 or second signal 216 is set as the reference clock 118 and the other one of first signal 214 or second signal 216 is set as the feedback clock 120.

In one or more examples, first signal 214 and second signal 216 may be set by signals that are indicative of the phase relationship between reference clock 118 and feedback clock 120, such as UP and DOWN signals generated by a phase/frequency detector, such as a bang-bang phase-frequency detector, without limitation. As long as the timing of the rising edges of first signal 214 and second signal 216 includes the phase information about the signals of interest (e.g., reference clock 118 and feedback clock 120, without limitation) they can be utilized by apparatus 200 to determine if a phase difference is within the phase-error threshold.

The output (Q) of first flip-flop 202 is coupled to the data (D) input of third flip-flop 220, an input of first delay circuit 208, and an input of NAND gate 206. The output (Q) of second flip-flop 204 is coupled to the data (D) input of fourth flip-flop 218, an input of second delay circuit 222, and the other input of NAND gate 206. The output of NAND gate 206 is coupled to respective reset (R) inputs of first flip-flop 202 and second flip-flop 204. The output of first delay circuit 208 is coupled to the clock (CLK) input of third flip-flop 220 and the output of second delay circuit 222 is coupled to the clock (CLK) input of fourth flip-flop 218. The Q output of third flip-flop 220 is coupled to a first input of NOR gate 210 and the Q output of fourth flip-flop 218 is coupled to a second output of NOR gate 210. The output of NOR gate 210 represents threshold detected signal 212.

The outputs (Q) of first flip-flop 202 and second flip-flop 204 are received at NAND gate 206. If both of the outputs (Q) of first flip-flop 202 and second flip-flop 204 are high state, then the output of NAND gate 206 is set to a low state, which low state at the output of NAND gate 206 resets first flip-flop 202 and second flip-flop 204 because their respective reset (R) inputs are active low. When first flip-flop 202 and second flip-flop 204 are reset, their outputs (Q) are forced to low state (i.e., low state at the reset (R) input overrides the data (D) input and clock (CLK) input and forces output (Q) to the low state).

When either or both of the outputs (Q) of first flip-flop 202 and second flip-flop 204 are in a low state, the output of NAND gate 206 is set to high state. The reset (R) inputs of first flip-flop 202 and second flip-flop 204 are active low, so when high state is received at respective reset (R) inputs, the first flip-flop 202 and second flip-flop 204 operate normally and do not reset, responding only to data (D) input and clock (clk) input.

Accordingly, if both of the outputs (Q) of first flip-flop 202 and second flip-flop 204 are in the high state, then NAND gate 206 resets both flip-flops causing respective outputs (Q) of first flip-flop 202 and second flip-flop 204 to be in a low state.

Assume for purposes of example that all of first flip-flop 202, second flip-flop 204, third flip-flop 220 and fourth flip-flop 218 are initialized to output a low state.

If the output (Q) of first flip-flop 202 changes to high state, responsive to a rising edge of first signal 214, and the output (Q) of second flip-flop 204 is in the low state, since the rising edge of second signal 216 has not yet occurred, the high state is received at the data (D) input of third flip-flop 220 and the input of first delay circuit 208, and the received high state is propagated through first delay circuit 208. The low state at the output (Q) of second flip-flop 204 is received at the data (D) input of fourth flip-flop 218 and the input of second delay circuit 222, and the received low state is propagated through second delay circuit 222.

After the predetermined delay time of first delay circuit 208 and second delay circuit 222, i.e., the delay set by phase threshold 116, the delayed high state (i.e., the output (Q) of first flip-flop 202 delayed by first delay circuit 208) is received at the clock (CLK) input of third flip-flop 220, so clock (CLK) input of third flip-flop 220 sees a change from low state to high state (rising edge) and triggers, thereby passing the high state received at the data (D) input of third flip-flop 220 to the Q output of third flip-flop 220. Also, after the predetermined delay time, the delayed low state (i.e., the delayed output (Q) of second flip-flop 204) is receive at the clock (CLK) input of fourth flip-flop 218, and fourth flip-flop 218 does not see a change from low state to high state and does not trigger. The output of third flip-flop 220 is a high state, and the output of fourth flip-flop 218 is the last value at data (D) input when it was triggered, in this example, a low state. The output of NOR gate 210, threshold detected signal 212, is thus low since the Q output of third flip-flop 220 is high. As indicated above, threshold detected signal 212 in the low state is indicative that the time difference between an occurrence of the rising edge of first signal 214 and an occurrence of the rising edge of second signal 216 is greater than phase threshold 116.

If second signal 216 exhibits a rising edge before the predetermined time delay, second flip-flop 204 is triggered setting the Q output of second flip-flop 204 to a high state. Since the Q outputs of first flip-flop 202 and second flip-flop 204 are in the high state, NAND gate 206 resets first flip-flop 202 and second flip-flop 204 so that the Q outputs of first flip-flop 202 and second flip-flop 204 fall to the low state. After the predetermined delay time of first delay circuit 208, the delayed high state (i.e., the output (Q) of first flip-flop 202 delayed by first delay circuit 208) is received at the clock (CLK) input of third flip-flop 220, so clock (CLK) input of third flip-flop 220 sees a change from low state to high state (rising edge) and triggers, thereby passing the low state received at the data (D) input of third flip-flop 220 to the Q output of third flip-flop 220. Similarly, after the predetermined delay time of second delay circuit 222, the delayed high state (i.e., the output (Q) of second flip-flop 204 delayed by second delay circuit 222) is received at the clock (CLK) input of fourth flip-flop 218, so clock (CLK) input of fourth flip-flop 218 sees a change from low state to high state (rising edge) and triggers, thereby passing the low state received at the data (D) input of fourth flip-flop 218 to the Q output of fourth flip-flop 218. The output of NOR gate 210, threshold detected signal 212, is thus high since the Q output of both third flip-flop 220 and fourth flip-flop 218 are low.

While the above has been described in an example of the rising edge of first signal 214 preceding the rising edge of second signal 216, those skilled in the art will recognize that the same results occur when the rising edge of second signal 216 precedes the rising edge of first signal 214.

If first signal 214 and second signal 216 both exhibit a rising edge within phase threshold 116 (i.e., the time between when first signal 214 exhibits a rising edge and second signal 216 exhibits a rising edge is less than phase threshold 116) then apparatus 200 sets threshold detected signal 212 to low state, and if both first signal 214 and second signal 216 do not exhibit a falling edge within phase threshold 116 (i.e., the time between when first signal 214 exhibits a rising edge and second signal 216 exhibits a rising edge is greater than phase threshold 116) than apparatus 200 sets threshold detected signal 212 to high state. In the specific non-limiting example depicted by FIG. 2, asserting threshold detected signal 212 is setting it to low state, and de-asserting threshold detected signal 212 is setting it to high state, but use of other states does not exceed the scope of this disclosure.

Figure 3:
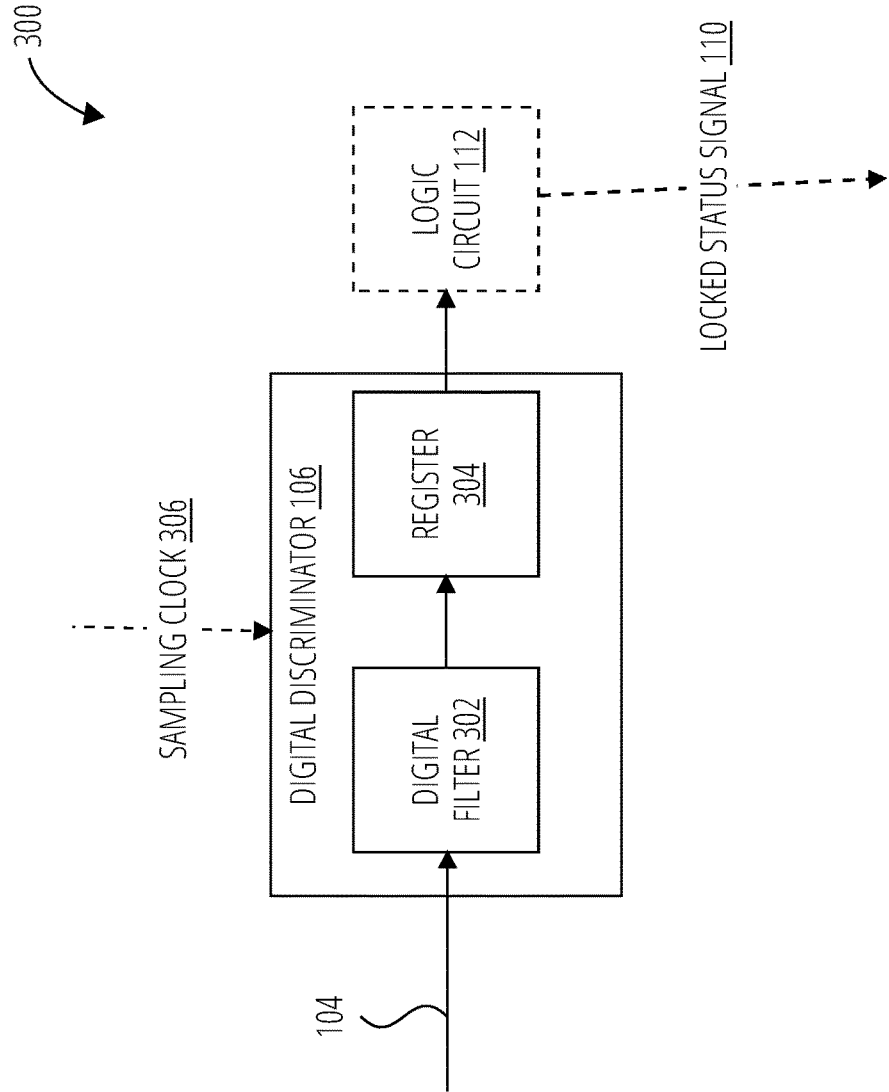
FIG. 3 is a block diagram of an apparatus for determining and indicating locked status of a clock tracking circuit, in accordance with one or more examples.

FIG. 3 is a block diagram of an apparatus 300 for discriminating between steady-state and transitory phase error in a status signal of a phase detector and optionally determining locked status based thereon, in accordance with one or more examples. Apparatus 300 is a non-limiting example of a digital discriminator 106 and logic circuit 112 of FIG. 1.

Apparatus 300 includes a phase detector 102, digital discriminator 106, and logic circuit 112. Digital discriminator 106 includes digital filter 302 and register 304.

Digital filter 302 filters the status signal 104 of phase detector 102 to block status signal that is indicative of transitory phase error and pass status signal that is indicative of steady-state phase error. By way of non-limiting example, digital filter 302 may be a digital low-pass filter that allows steady-state phase error signals to pass while attenuating high-frequency transitory phase error signals. Non-limiting examples of a digital low-pass filter include a moving average filter, a finite impulse response (FIR) filter, a digital loop filter, and adaptive filters.

Register 304 receives and stores the status signal samples provided by digital filter 302. The status signal samples include the steady-state phase error information that may be used to determine the locked status of the clock tracking circuit.

Logic circuit 112 monitors the status signal samples stored at the register 304, determines locked status information from the status signal samples, determines the locked status of the clock tracking circuit at least partially based on the status information, and sets locked status signal 110 to indicate the determined locked status.

Figure 4:
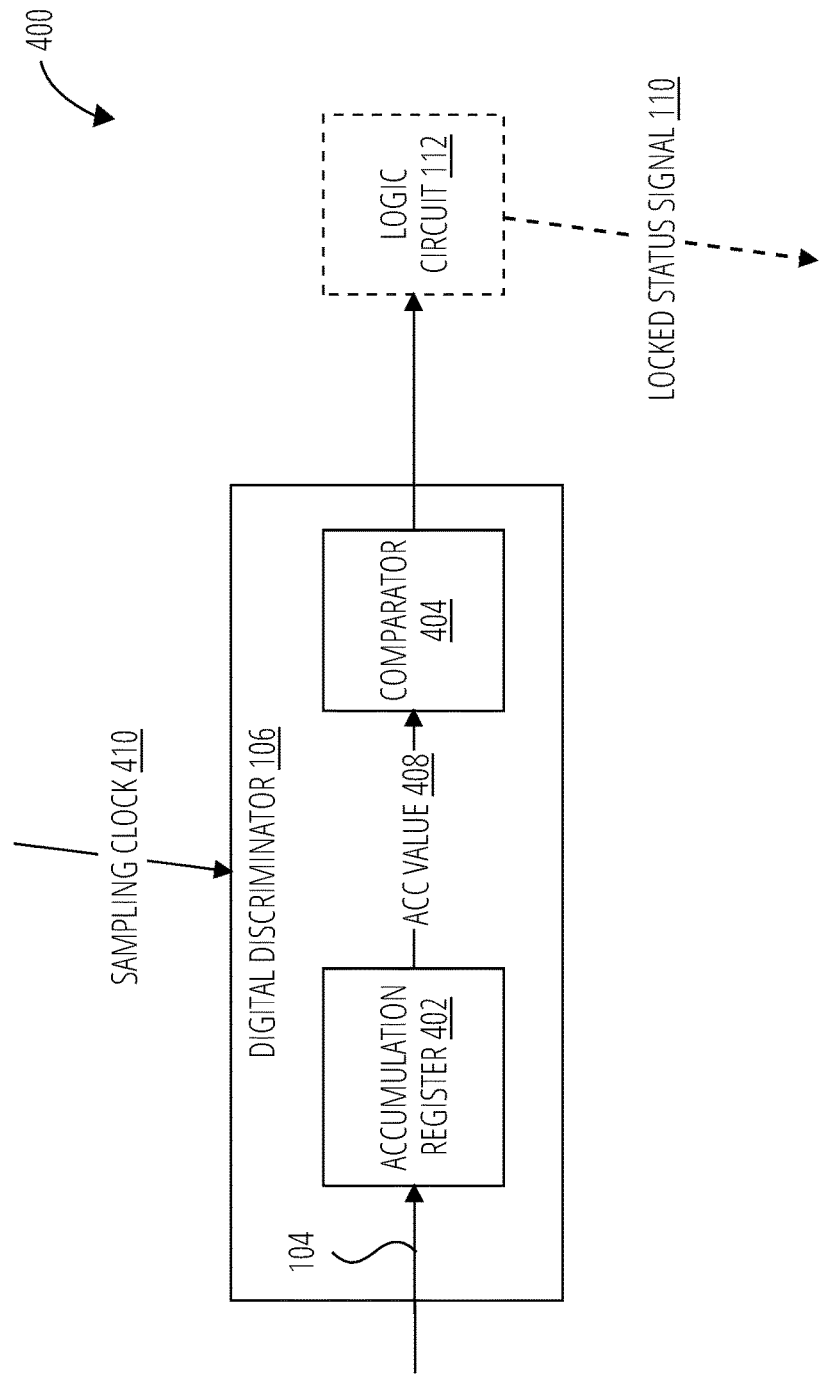
FIG. 4 is a block diagram of an apparatus for determining and indicating locked status of a clock tracking circuit, in accordance with one or more examples.

FIG. 4 is a block diagram of an apparatus 400 for discriminating between steady-state and transitory phase error in a status signal of a phase detector and optionally determining locked status based thereon, in accordance with one or more examples. Apparatus 400 is a non-limiting example of a digital discriminator 106 and logic circuit 112 of FIG. 1.

Apparatus 400 includes digital discriminator 106 and logic circuit 112. Digital discriminator 106 includes accumulation register 402 and comparator 404.

Accumulation register 402 accumulates states of status signal 104. The accumulated value 408 ("acc value 408") stored at accumulation register 402, which represents the integral of the states of status signal 104, is provided to comparator 404. The integral of the status of status signal 104 is the steady-state phase error information.

Comparator 404 is a digital comparator that determines the relationship between acc value 408 and a threshold value and sets respective outputs of comparator 404 to indicate the determined relationship. In one or more examples, the relationships may be whether or not the accumulated value is less than or greater than a predetermined threshold. If it is greater than the predetermined threshold that indicates the locked status of the clock tracking circuit is a locked state, and if it is less than the predetermined threshold that indicates the locked status of the clock tracking circuit is not locked state. Logic circuit 112 may set locked status signal 110 to indicate that locked status indicated by comparator 404. Alternatively, in one or more examples, the output of comparator 404 may be provided as locked status signal 110.

In one or more examples, the number of samples generated is at least partially based on a sampling rate. In one or more examples, the sampling rate at apparatus 400 may be set to cause a suitable resolution for the digital discriminator 106 to process the status signal 104 and maintain the steady-state phase error information. A suitable resolution is one that ensures a set of status signal samples is representative of phase error information. Generally speaking, the higher the sample rate, the greater the number of status signal samples, and the higher the resolution.

In some cases, a processing rate may be set at phase detector 102 as discussed below, to increase the resolution of status signal 104. Status signal 104 may be a digital signal, which is a discrete time, discrete value signal. Increasing the processing rate phase detector 102 increases the frequency with which it updates status signal 104. One way to increase the processing rate is to increase the clock rate of feedback clock 120 and reference clock 118.

Figure 5:
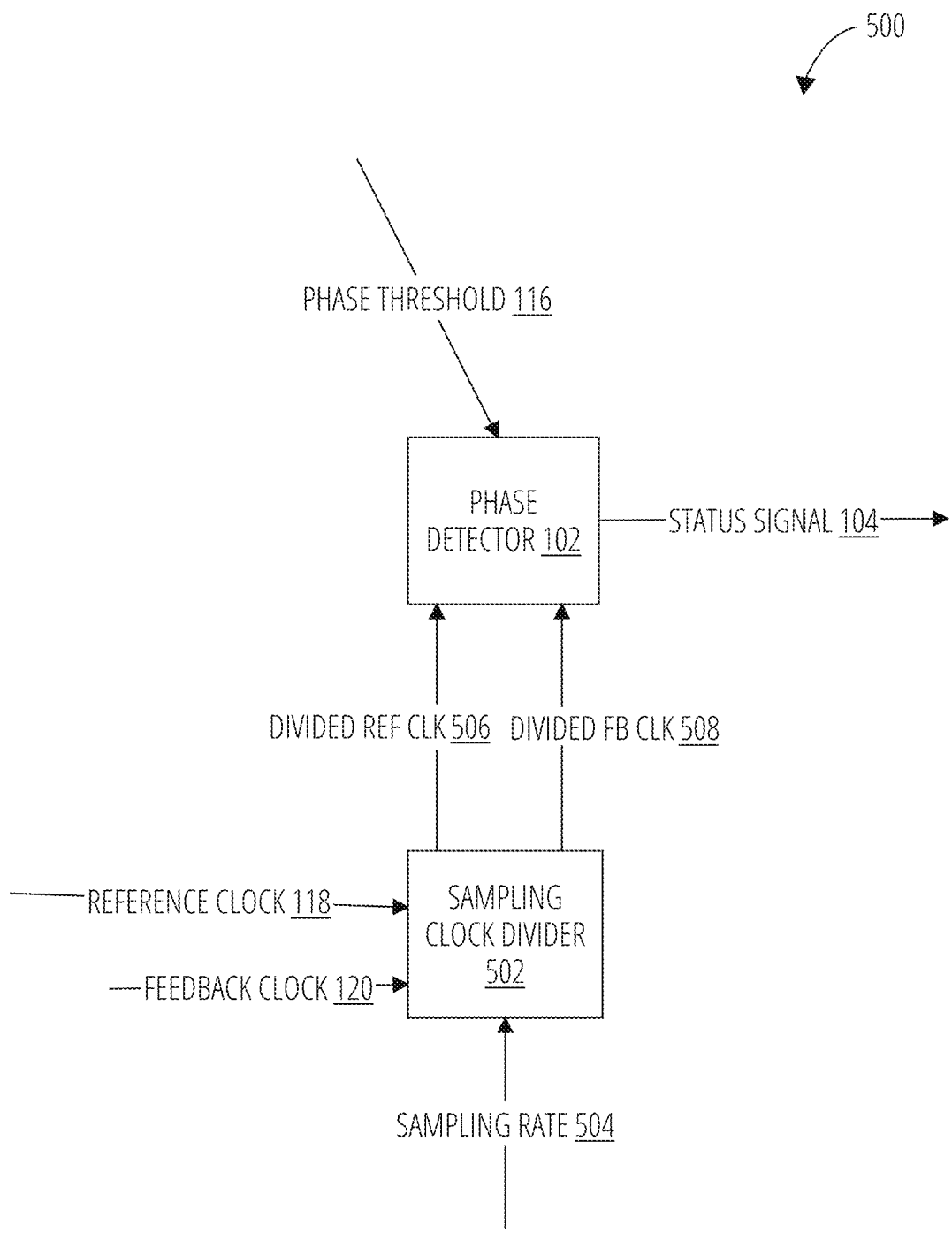
FIG. 5 is a block diagram depicting an apparatus for setting a sampling rate, in accordance with one or more examples.
Figure 6:
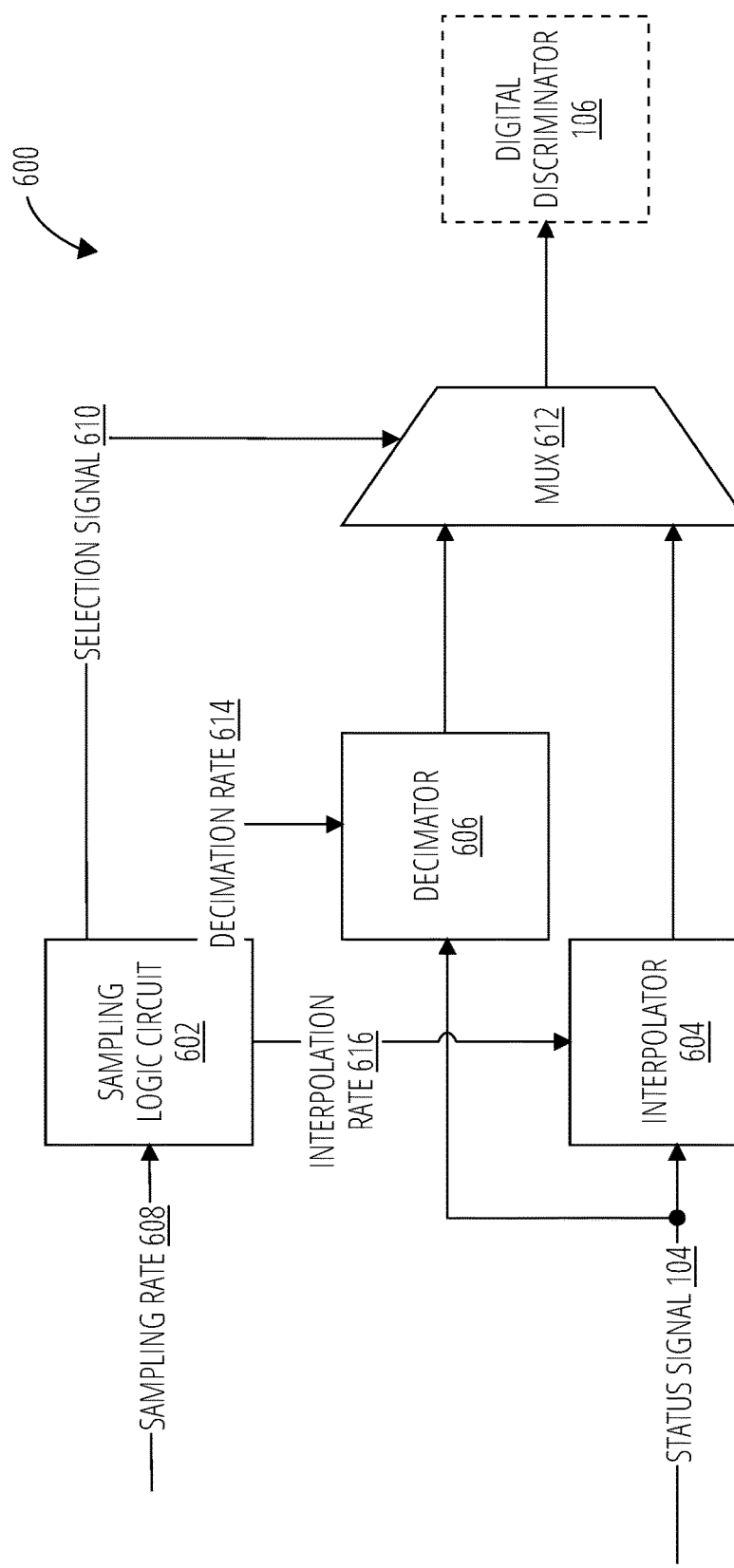
FIG. 6 is a block diagram depicting an apparatus for sampling a status signal of the phase detector at a set sampling rate, in accordance with one or more examples.

FIG. 5 is a block diagram depicting an apparatus 500 for setting a sampling rate, in accordance with one or more examples. Apparatus 500 includes phase detector 102 and sampling clock divider 502.

Sampling clock divider 502 receives feedback clock 120, reference clock 118, and sampling rate 504, frequency divides feedback clock 120 and reference clock 118 by an amount that corresponds to sampling rate 504 and produces divided reference clock 506 and divided feedback clock 508. Clock rates of divided reference clocks 506 and divided feedback clock 508 may be greater than or less than of reference clock 118 and feedback clock 120, based on, for example, sampling rate 504.

Sampling rate 504 may be a value that represents, as a non-limiting example, a number of clock cycles per sampling interval, a number of samples per unit interval, or a divisor. Sampling rate 504 may be pre-set by a user or logic circuit.

Apparatus 600 includes sampling logic circuit 602, interpolator 604, decimator 606, multiplexer 612, and optionally digital discriminator 106.

Sampling logic circuit 602 receives the sampling rate 608, determines whether to perform up-sampling based on the sampling rate 608, i.e., to increase the number of samples based on interpolation, or down-sampling, reduce the number of samples based on decimation, generates decimation rate 614 for decimator 606 or interpolation rate 616 for interpolator 604 at least partially based on the determination, and generates selection signal 610 to selects the output of decimator 606 or interpolator 604 via multiplexer 612 as the status signal samples provided to digital discriminator 106. If sampling logic circuit 602 determines, based on the sampling rate 608, to perform up-sampling, sampling logic circuit 602 determines a value for a target interpolation rate based on sampling rate 608, and sets interpolation rate 616 based on the determined value. In one or more examples, when up-sampling, sampling logic circuit 602 may set decimation rate 614 to a value indicative of no decimation. If sampling logic circuit 602 determines, based on sampling rate 608, to perform down-sampling, sampling logic circuit 602 determines a value for target decimation rate based on sampling rate 608 and sets decimation rate 614 based on the determined value. In one or more examples, when down-sampling, sampling logic circuit 602 may set interpolation rate 616 to value indicative of no interpolation. Decimator 606 receives status signal 104 and decimation rate 614, selects every Nth value of status signal 104 (where the Nth value is at least partially based on the decimation rate 614), and provides the selected values as the status signal samples. As a non-limiting example, decimator 606 may include a shift register to hold and move bits of status signal 104 and a logic circuit to select which values of status signal 104 to keep (and conversely, which values to discard). Decimator 606 keeps the values of status signal 104 that the logic circuit selects to keep and discards the rest of the values.

Interpolator 604 receives status signal 104 and interpolation rate 616, up samples values for status signal 104 at least partially based on interpolation rate 616, and provides the up sampled values as the status signal samples. As a non-limiting example, interpolator 604 may include a shift register hold and move bits of original values of status signal 104 and thereby insert gaps (e.g., respective gaps may comprise one or more zeros, without limitation) between the bits of original values of status signal 104, and a logic circuit to interpolate values between the original values of status signal 104 and replace the zeros with the interpolated values (fill the gaps).

Sometimes it may be advantageous for the sampling clock or signal that sets the sampling rate of status signal 104 to be at least partially based on the reference clock 118, feedback clock 120, or the phase difference therebetween, to increase the amount of steady-state phase information in status signal 104 or samples thereof.

Sometimes it may be advantageous for the sampling clock or signal that sets the sampling rate of status signal 104 to be at least partially based on the reference clock 118, feedback clock 120, or the phase difference therebetween, to increase the amount of steady-state phase information in status signal 104 or samples thereof.

Figure 7:
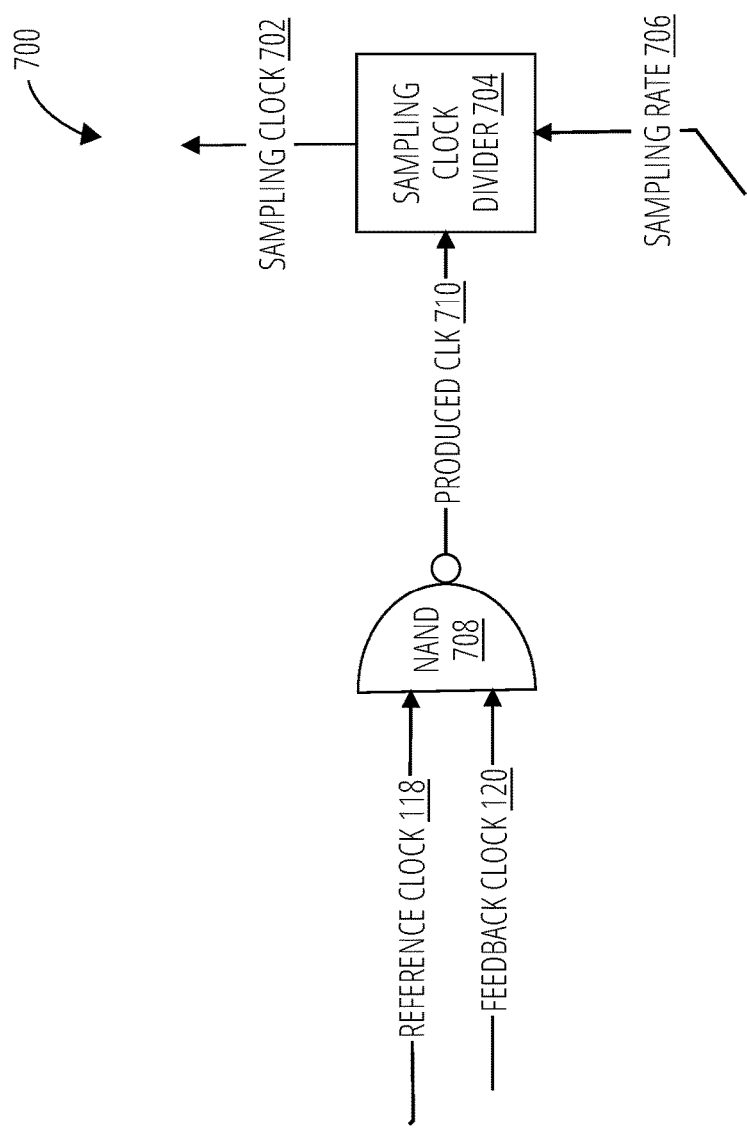
FIG. 7 is a block diagram depicting an apparatus for generating a sampling clock for sampling a status signal of a phase detector, in accordance with one or more examples.

FIG. 7 is a block diagram depicting an apparatus 700 for generating a sampling clock for sampling a status signal of a phase detector, in accordance with one or more examples. Apparatus 300 is a non-limiting example of clock source for optional sampling clock 306 or optional sampling clock 410.

Apparatus 700 includes sampling clock divider 704 and NAND gate 708. Sampling clock divider 704 receives produced clk 710 and sampling rate 706, divides produced clk 710 at least partially based on sampling rate 706 and generates sampling clock 702. NAND gate 708 generates produced clk 710 at least partially based on a reference clock 118 and feedback clock 120.

Figure 8:
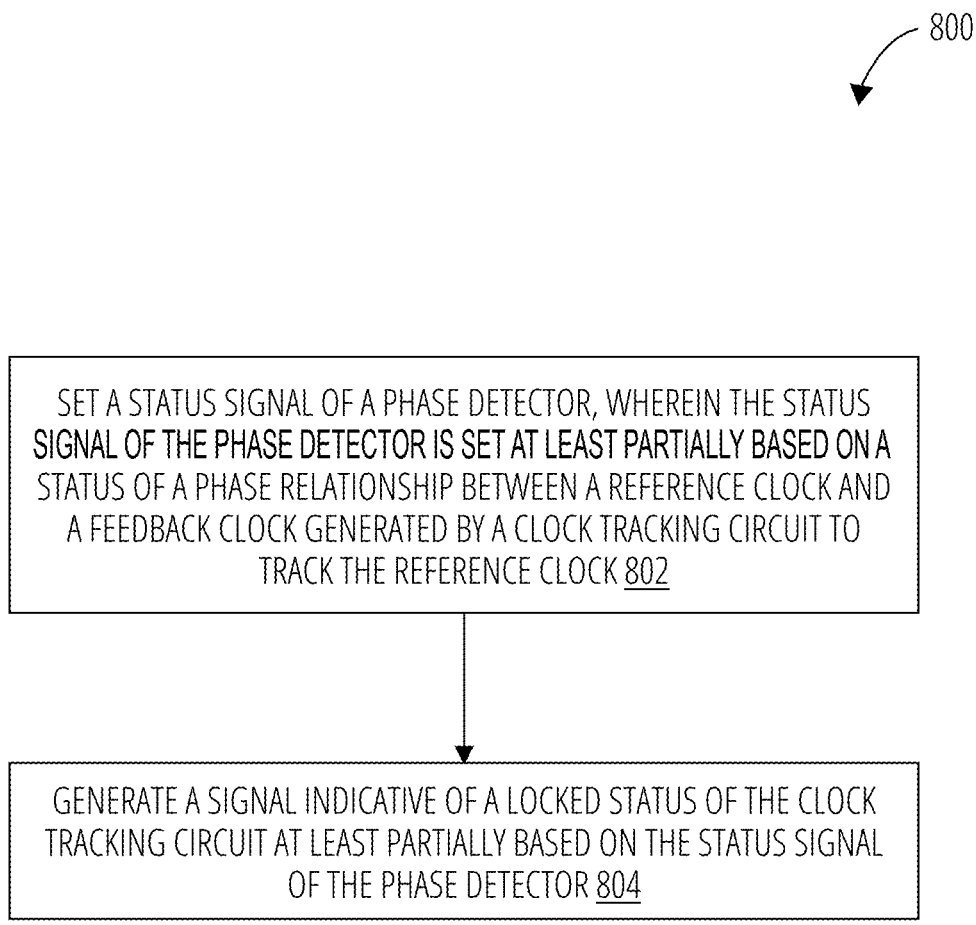
FIG. 8 is a flow diagram depicting a process to determine a locked status of a clock tracking circuit, in accordance with one or more examples.

FIG. 8 is a flow diagram depicting a process 800 to determine a locked status of a clock tracking circuit, in accordance with one or more examples.

Although the example process 800 depicts a particular sequence of operations, the sequence may be altered without departing from the scope of the present disclosure. For example, some of the operations depicted may be performed in parallel or in a different sequence that does not materially affect the function of the process 800. In other examples, different components of an example device or system that implements the process 800 may perform functions at substantially the same time or in a specific sequence.

According to one or more examples, process 800 includes setting a status signal of a phase detector, wherein the status signal of the phase detector is set at least partially based on an amount of phase difference between a reference clock and a feedback clock generated by a clock tracking circuit to track the reference clock at operation 802. In one or more examples, the status signal may be set directly based on the feedback clock and reference clock, or directly based on one or more signals indicative of the phase difference between the reference clock and the feedback clock such as UP signals and DOWN signals generated by a phase-frequency detector.

According to one or more examples, process 800 includes generating a signal indicative of a locked status of the clock tracking circuit at least partially based on the status signal of the phase detector at operation 804.

Figure 9:
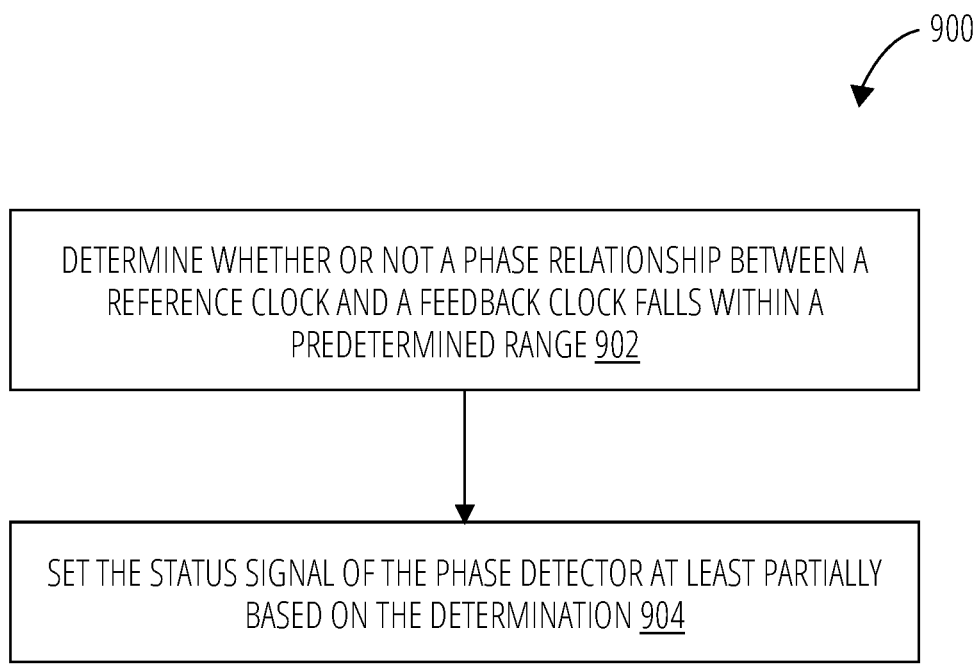
FIG. 9 is a flow diagram depicting a process to set a status signal of a phase detector, in accordance with one or more examples.

FIG. 9 is a flow diagram depicting a process 900 to set a status signal of a phase detector, in accordance with one or more examples. Some or a totality of operations of process 900 may be performed, as a non-limiting example, by apparatus 100, phase detector 102, or apparatus 200.

Although the example process 900 depicts a particular sequence of operations, the sequence may be altered without departing from the scope of the present disclosure. For example, some of the operations depicted may be performed in parallel or in a different sequence that does not materially affect the function of the process 900. In other examples, different components of an example device or system that implements the process 900 may perform functions at substantially the same time or in a specific sequence.

According to one or more examples, process 900 includes determining whether or not a phase relationship between a reference clock and a feedback clock falls within a predetermined range at operation 902. In one or more examples, the phase relationship is a phase difference between the reference clock and the feedback clock. In one or more examples, the phase threshold represents a boundary condition for the predetermined range. At operation 902, process 900 examines whether the phase relationship between the reference clock and the feedback clock falls within a predetermined range utilizing the phase threshold and need not measure the exact phase difference.

According to one or more examples, process 900 includes setting the status signal of the phase detector at least partially based on the determination at operation 904. In one or more examples, operation 902 is a binary check, either the phase relationship is within the phase threshold or it is not. Setting the status signal may include setting it a value indicative of the result of the binary check of operation 902.

Figure 10:
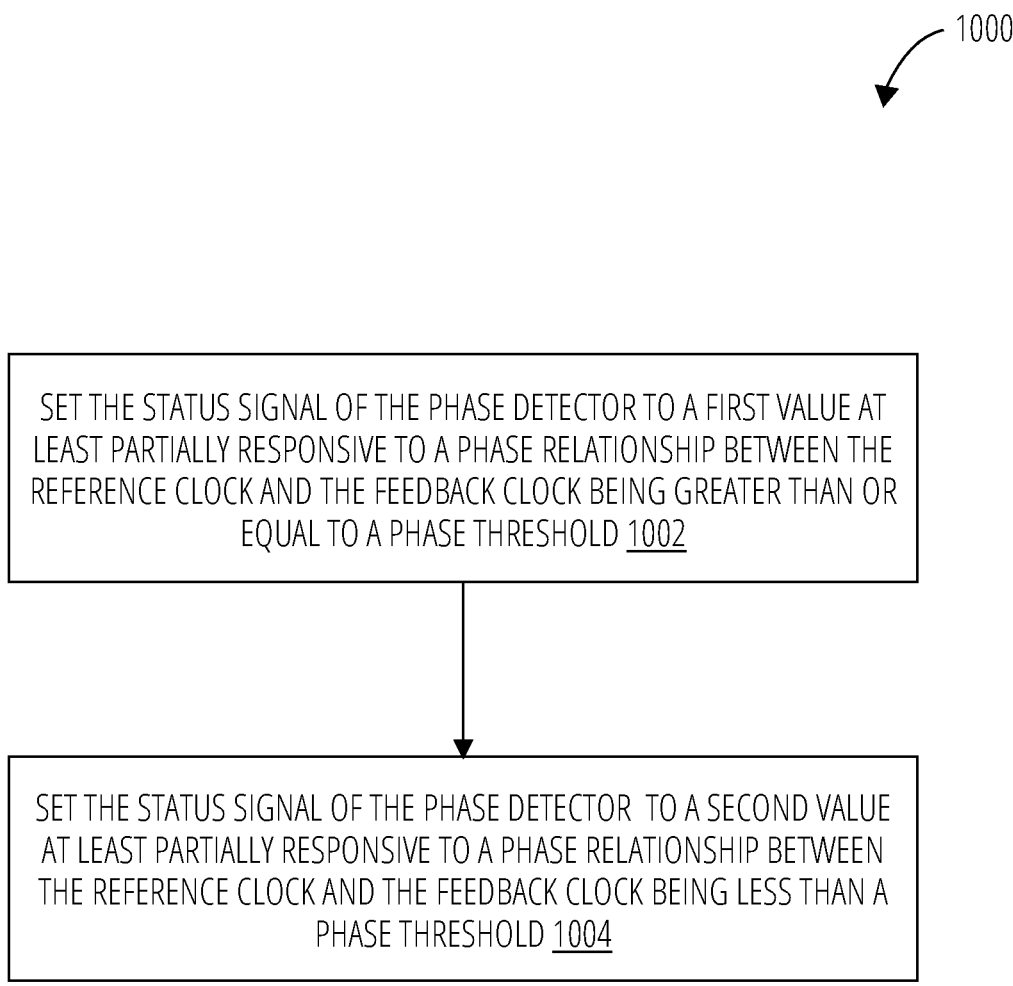
FIG. 10 is a flow diagram depicting a process to set the status signal of the phase detector, in accordance with one or more examples.

FIG. 10 is a flow diagram depicting a process 1000 to set the status signal of the phase detector, in accordance with one or more examples.

Although the example process 1000 depicts a particular sequence of operations, the sequence may be altered without departing from the scope of the present disclosure. For example, some of the operations depicted may be performed in parallel or in a different sequence that does not materially affect the function of the process 1000. In other examples, different components of an example device or system that implements the process 1000 may perform functions at substantially the same time or in a specific sequence.

According to one or more examples, process 1000 includes setting the status signal of the phase detector to a first value at least partially responsive to determining that a determined amount of difference is greater than a phase threshold at operation 1002.

According to one or more examples, process 1000 includes setting the status signal of the phase detector to a second value at least partially responsive to determining that a determined amount of difference is equal to or less than the phase threshold, wherein the second value is different than the first value at operation 1004.

Figure 11:
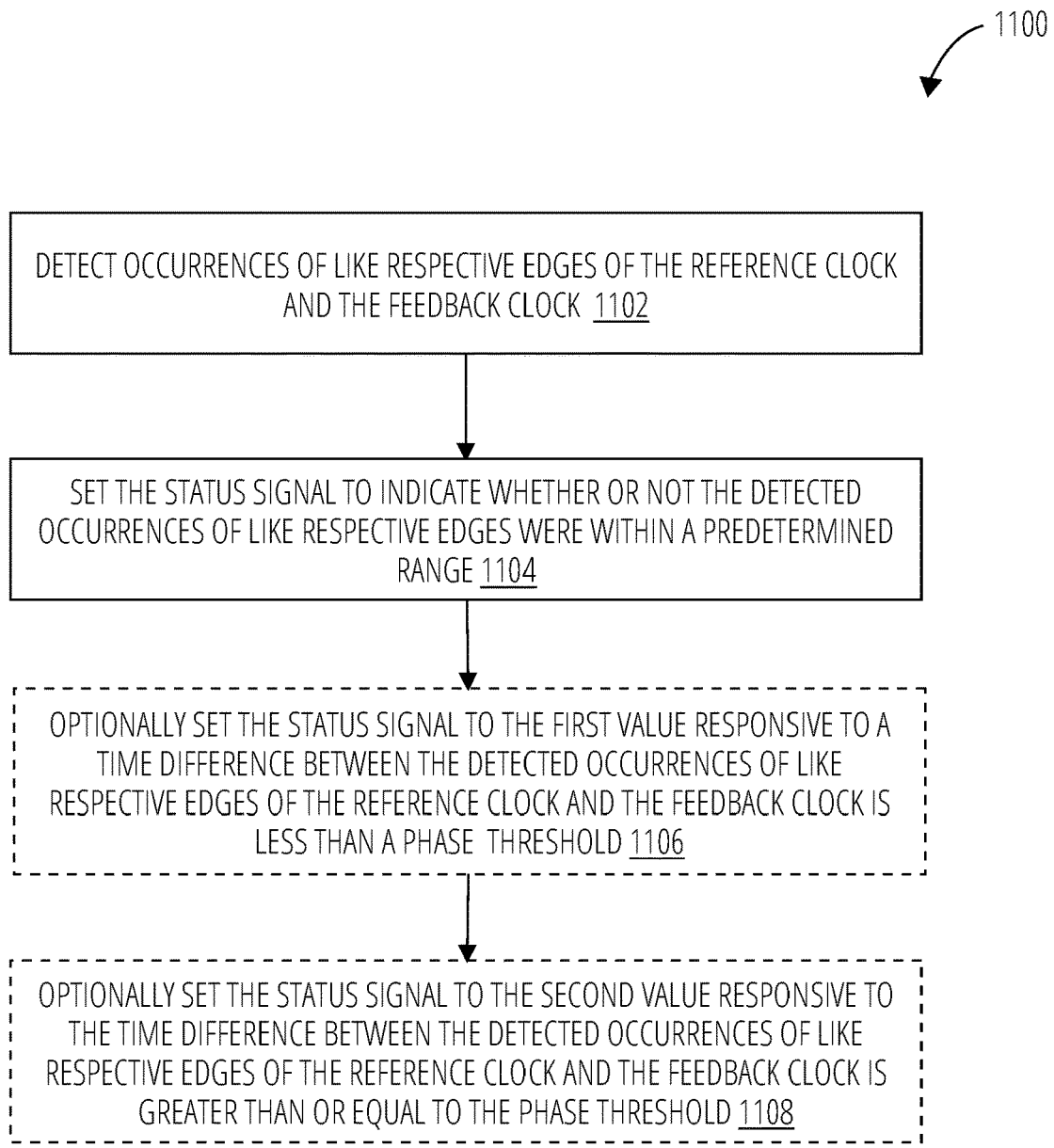
FIG. 11 is a flow diagram depicting a process for setting a status signal to indicate a status of phase difference between a reference clock and a feedback clock, in accordance with one or more examples.

FIG. 11 is a flow diagram depicting a process 1100 for setting a status signal to indicate a status of phase difference between a reference clock and a feedback clock, in accordance with one or more examples. Some or a totality of operations of process 2200 may be performed by, as a non-limiting example, by apparatus 1600 or phase error detector 1604.

Although the example process 1100 depicts a particular sequence of operations, the sequence may be altered without departing from the scope of the present disclosure. For example, some of the operations depicted may be performed in parallel or in a different sequence that does not materially affect the function of the process 1100. In other examples, different components of an example device or system that implements the process 1100 may perform functions at substantially the same time or in a specific sequence.

According to one or more examples, the process 1100 includes detecting occurrences of like respective edges of the reference clock and the feedback clock at operation 1102.

According to one or more examples, the process 1100 includes setting the status signal to indicate whether or not the detected occurrences of like respective edges were within a predetermined range at operation 1104.

According to one or more examples, the process 1100 includes optionally setting the status signal to the first value responsive to a time difference between the detected occurrences of like respective edges of the reference clock and the feedback clock is less than the phase threshold at operation 1106.

According to one or more examples, the process 1100 includes optionally setting the status signal to the second value responsive to the time difference between the detected occurrences of like respective edges of the reference clock and the feedback clock is greater than or equal to the phase threshold at operation 1108.

Figure 12:
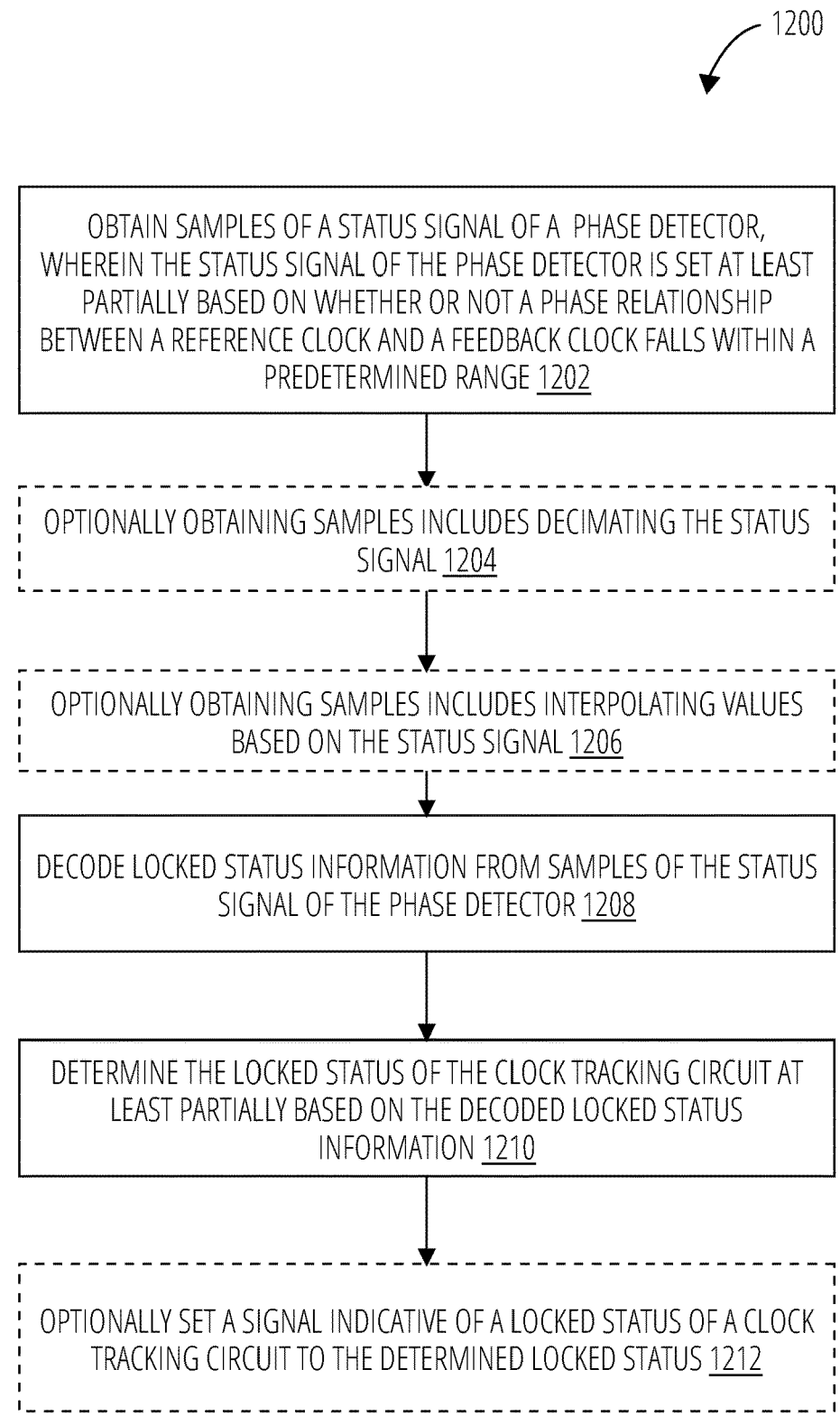
FIG. 12 is a flow diagram depicting a process to determine the locked status of the clock tracking circuit at least partially based on the status signal of a phase detector, in accordance with one or more examples.

FIG. 12 is a flow diagram depicting a process 1200 to determine the locked status of a clock tracking circuit at least partially based on a status signal of a phase detector, in accordance with one or more examples.

Although the example routine depicts a particular sequence of operations, the sequence may be altered without departing from the scope of the present disclosure. For example, some of the operations depicted may be performed in parallel or in a different sequence that does not materially affect the function of the routine. In other examples, different components of an example device or system that implements the routine may perform functions at substantially the same time or in a specific sequence.

According to one or more examples, process 1200 includes obtaining samples of a status signal of a phase detector, the status of the phase detector is set at least partially based on whether or not a phase relationship between a reference clock and a feedback clock falls within a predetermined range at operation 1202. In one or more examples, process 1200 may obtain samples by processing (e.g., via digital discriminator 106, without limitation) the status signal in a manner that passes or keeps steady-state phase error information and discards or blocks transitory phase error information.

According to one or more examples, process 1200 includes optionally obtaining samples including decimating the status signal at operation 1204.

According to one or more examples, process 1200 includes optionally obtaining samples including interpolating values based on the status signal at operation 1206.

Optional operation 1206 and optional operation 1208, some or a totality of operations for decimation, interpolation, or both may be performed, as a non-limiting example, by apparatus 600. In one or more examples, a decimation rate or interpolation rate may be set in response to or based on a sampling rate.

According to one or more examples, process 1200 includes decoding status information from samples of the status signal of phase detector at operation 1208.

According to one or more examples, process 1200 includes determining the locked status of the clock tracking circuit at least partially based on the decoded status information at operation 1210.

According to one or more examples, process 1200 includes optionally set a signal indicative of a locked status of a clock tracking circuit to the determined locked status at operation 1212.

Figure 13:
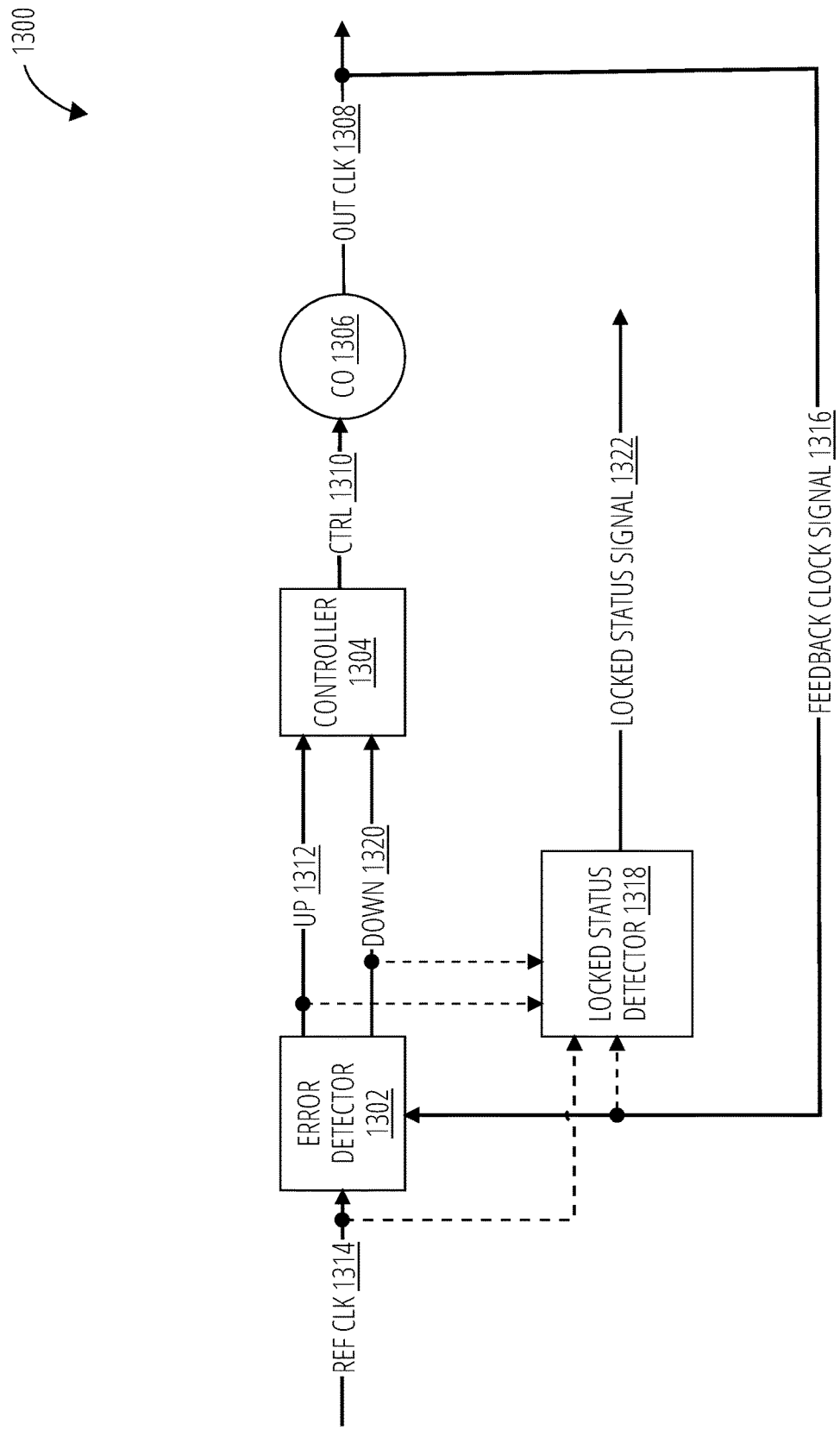
FIG. 13 is a block diagram depicting a clock tracking circuit that provides locked status determination, in accordance with one or more examples.

FIG. 13 is a block diagram depicting an apparatus 1300 to track a clock (and may also be referred to herein as a "clock tracking circuit 1300"), that offers locked status determination in accordance with one or more examples. In one or more examples, clock tracking circuit 1300 may be a hybrid PLL or digital PLL.

Clock tracking circuit 1300 operates, generally, to generate an output clock signal 1308 phase-locked and frequency-locked to reference clock 1314. Clock tracking circuit 1300 includes an error detector 1302, a controller 1304, a controlled-oscillator 1306, and a locked status detector 1318.

Locked status detector 1318 determines the locked status of clock tracking circuit 1300 and generates locked status signal 1322 to indicate the determined locked status. In one or more examples, locked status detectors 1318 may be or include an apparatus 100 or apparatus 300.

In one or more examples, locked status detector 1318 may determine locked status of clock tracking circuit 1300 based on reference clock 1314 and feedback clock signal 1316, or, alternatively, the error signal generated by error detector 1302. FIG. 13 depicts a specific non-limiting example where error detector 1302 generates two error signals that include magnitude and direction information about the phase difference between a set of sample reference clock 1314 and feedback clock signal 1316 and indirectly about the frequency difference between reference clock 1314 and feedback clock signal 1316. This disclosure is not limited to determining locked state based on error signals in those cases where the error signals are UP and DOWN signals. Any error signal where the timing of falling edges includes phase information about signals of interest (e.g., reference clock 118 and feedback clock 120, without limitation) may be utilized. In cases where, as non-limiting examples, the error signals generated by error detector 1302 are not suitable for determining locked status of a clock tracking circuit 1300 or where operating conditions might otherwise dictate, reference clock 1314 and feedback clock signal 1316 may be utilized to determined locked status of clock tracking circuit 1300.

Error detector 1302 receives reference clock 1314 and feedback clock signal 1316 and generates error signals including UP 1312 and DOWN 1320 at least partially responsive thereto. More specifically, error detector 1302 generates an error signal that is proportional to the phase difference between two input signals to error detector 1302. More specifically, the magnitude and direction of the error signals are proportional to the phase difference between the input signals. If the phase and frequency of the two input signals is substantially the same, the magnitude and direction information in UP 1312 and DOWN 1320 will be zero, indicating that the phase and frequency of the two signals are the same. If there is a phase or frequency difference between the two input signals, then the magnitude and direction information in UP 1312 or DOWN 1320 will be non-zero and proportional to the difference between the phase (and indirectly, the frequency) of the two input signals.

In one or more examples, error detector 1302 may be a binary phase detector that generates error detector 1302 as a binary signal having two separate and distinct component signals, an UP signal and a DOWN signal. Error detector 1302 generates the UP signal and the DOWN signal as a series of pulses, where pulses on respective ones of the UP signal and DOWN signal indicate the magnitude and direction of error. The one of the UP signal and the DOWN signal that first exhibits a pulse indicates which one of the two input-selected signals leads the other; and, conversely, which one of the two input-selected signals lags the other. The magnitude of the error signal is represented by the pulse width of a pulse generated in the UP signal or DOWN signal. A larger pulse width indicating a larger phase difference between the two input signals, and a smaller pulse width indicating a smaller phase difference. One of the inputs of error detector 1302 is preset as the reference input that is led, lagged, or locked to, and the other one of the inputs of error detector 1302 is preset as the feedback (or "controlled") input that is leading, lagging, or locked on. As a non-limiting example, in a clock-tracking circuit the reference signal is provided to the reference input, and the output signal (or derivative thereof) is provided to the feedback input.

Reference clock 1314 may be generated by any suitable clock source for a given operational context. Feedback clock signal 1316 may be the same as output clock signal 1308 generated by clock tracking circuit 1300 (e.g., output clock signal 1308 is provided directly to an input of error detector 1302, without limitation) or may be a clock signal indicative of the phase and frequency of output clock signal 1308. For example, the phase and frequency of feedback clock signal 1316 may be the same or different than output clock signal 1308, but in either case, is relatable back to the phase and frequency of output clock signal 1308. In one or more examples, feedback clock signal 1316 may be a frequency divided version of output clock signal 1308 (e.g., via a frequency divider or buffer, without limitation). In one or more, error detector 1302 may be any suitable error detector for producing a digital signal that represents the phase error between reference clock 1314 and feedback clock signal 1316, as a non-limiting example, a bang-bang phase detector, without limitation.

Digitally controlled-oscillator 1306 is an electronic oscillator for generating output clock signal 1308 at least partially in response to control signal 1310, which control signal 1310 are a digital control signal or digital control code. The control signal 1310 is fed to an input of digitally controlled-oscillator 1306.

Controller 1304 provides control signal 1310 to digitally controlled-oscillator 1306 to adjust output clock signal 1308. In one or more examples, controller 1304 may include circuits (analog circuits, digital circuits, or both) to provide a proportional control path and an integral control path for control of digitally controlled-oscillator 1306.

A typical phase-frequency detector (PFD) is rising-edge triggered or falling-edge triggered, but not both rising-edge triggered and falling-edge triggered. To utilize rising edges and falling edges of input clock signals, sometimes two PFDs are utilized: one of the PFDs is triggered by rising-edges, the other one of the PFDs is triggered by falling-edges.

Ideally, the two PFDs are perfectly matched at least in terms of: rise and fall times, input to output delay (also called "response time"), layout, output load, and non-idealities (e.g., non-idealities that result from the from fabrication process, without limitation). A rising edge triggered PFD and falling edge triggered PFD may exhibit differences in behavior that are non-negligible because they are not perfectly matched. So, sometimes two PFDs are utilized that are triggered by like edges (i.e., both PFDs are rising edge triggered or both PFDs are falling edge triggered), and one of the PFDs receives a non-inverted version of the input clock signals, and the other one of the PFDs receives an inverted version of the input clock signals.

Edge locking ambiguity may occur when an edge having a first polarity is converted to an edge having a second, different polarity (e.g., a rising edge converted to a falling edge or vice-versa, without limitation), respectively, for dual-edge detection. A clock tracking circuit utilizing dual-edge detection may false-lock a rising edge to falling edge or vice-versa because of a PFD transfer curve NULL condition at about 180-degrees. A NULL condition at 180-degrees, i.e., where two signals are 180-degrees out of phase, is a false positive and may cause a clock tracking circuit to be locked out-of-phase. If the clock tracking circuit locks out of phase, e.g., a rising edge with a falling edge, it may require intervention to unlock.

Additionally, due to differences between rising and falling edge detection circuit paths, a reference spur may arise when the clock tracing circuit locks to opposite edge. Reference spurs degrade noise performance. A "reference spur" is an undesired phase or frequency component in an output signal due to residual difference between the output signal and the reference signal that remain uncorrected due, as non-limiting examples, to non-idealities and imperfections in the error detector or loop filter.

Figure 14:
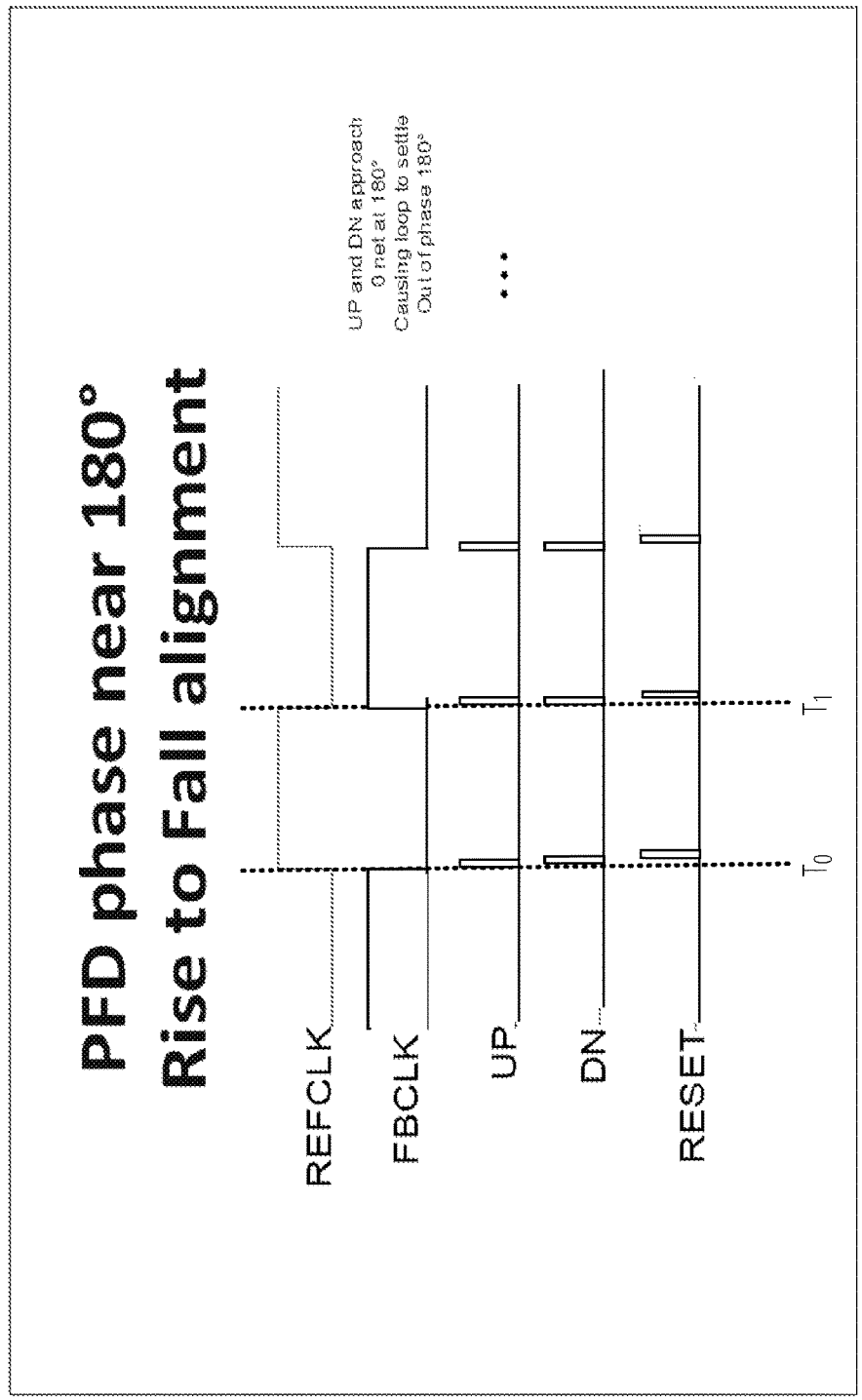
FIG. 14 is a timing diagram depicting a non-limiting example of a conventional dual-edge-based lock detection that experiences a NULL condition at 180-degrees.

FIG. 14 is a timing diagram 1400 depicting a non-limiting example of a conventional dual-edge-based lock detection that experiences a false NULL condition at 180-degrees, as known to the inventors of this disclosure.

Timing diagram 1400 includes waveforms for signals: reference clock, feedback clock, UP signal, DOWN signal, and RESET signal. The waveforms depict an example with 180-degrees phase difference (Δφ) between feedback clock and reference clock.

At time $T_0$, the UP signal is asserted (rising edge) in response to a rising edge of the reference clock (REFCLK) and DOWN signal is asserted (rising edge) in response to a falling edge of the feedback clock (FBCLK). A short time duration after time $T_0$, the RESET signal is asserted (rising edge) in response to both the reference clock and the feedback clock being high state. Both the UP signal and the DOWN signal are de-asserted (falling edge) in response to the asserted RESET signal.

At time $T_1$, the UP signal is asserted (rising edge) in response to a falling edge of the reference clock (REFCLK) and DOWN signal is asserted (rising edge) in response to a rising edge of the feedback clock (FBCLK). A short time duration after time $T_1$, the RESET signal is asserted (rising edge) in response to both the reference clock and the feedback clock being high state. Both the UP signal and the DOWN signal are de-asserted (falling edge) in response to the asserted RESET signal.

If a phase comparison were performed based on the UP signal and DOWN signal, the phase difference would appear to be zero or negligible, and a conventional dual-edge-based lock detector might determine, based on these UP and DOWN signals, that the clock tracking circuit is in a locked state.

Sometimes, edges occur during a PFD reset time interval and are missed. Missed edges may cause false NULL condition when the input signals are 180-degrees out of phase.

Figure 15:
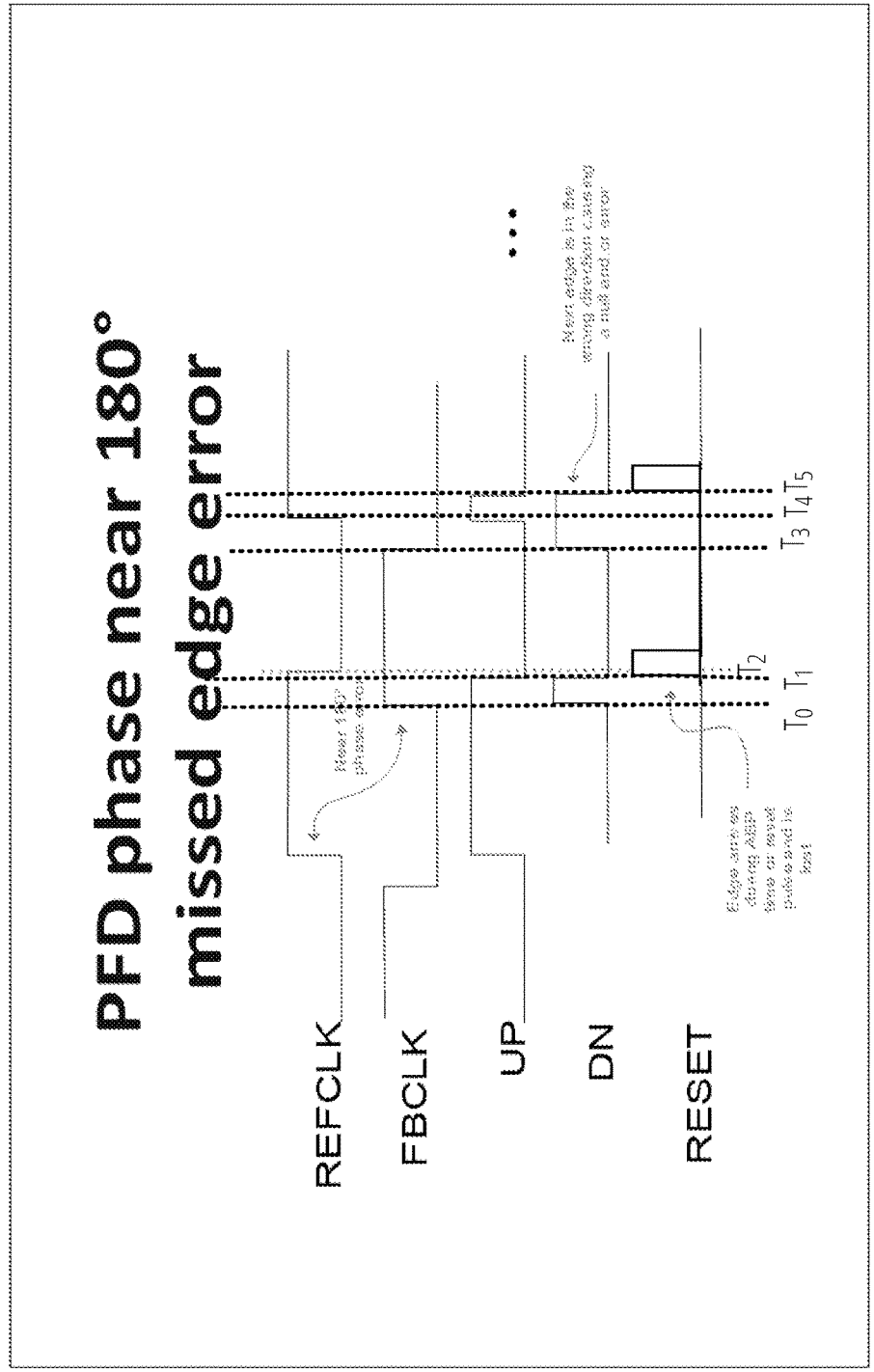
FIG. 15 is a timing diagram depicting a non-limiting example of a conventional dual-edge-based lock detection that experiences a NULL condition at 180-degrees due to a missed edge caused by a RESET.

FIG. 15 is a timing diagram 1500 depicting a non-limiting example of a false NULL condition at 180-degrees out of phase due to a missed edge, as known to the inventors of this disclosure.

At time $T_0$, the DOWN signal is asserted (rising edge) in response to the rising edge of the feedback clock. The UP signal was already in a high state having been asserted earlier in response to the rising edge of the reference clock. Notably, the phase difference between the reference clock and the feedback clock is nearly 180 degrees.

At time $T_1$, the RESET signal is asserted (rising edge) in response to rising edges of both the UP signal and the DOWN signal being high state.

At time $T_2$, while the RESET signal is being asserted, the reference clock exhibits a falling edge and the falling edge of the reference clock is missed. The next edge that is detected is the falling edge of feedback clock at time $T_3$, and the DOWN signal is asserted (rising edge) in response to the falling edge of feedback clock.

At time $T_4$, the UP signal is asserted (rising edge) in response to a rising edge of reference clock.

At time $T_5$, the RESET signal is asserted (rising edge) in response to both UP signal and DOWN signal being in the high state. Also, at time $T_5$, both UP signal and DOWN signal are de-asserted (falling edge) in response to RESET signal being asserted.

In the case depicted by FIG. 15, the phase information in the first set of UP and DOWN signals is accurate, but the phase information in the second set of UP and DOWN signals is not accurate due to the missed falling edge of the reference clock.

One or more examples relate to single- and dual-edge-triggered phase error detection. The dual edge phase error detection is not performed until the phase error is less than false NULL condition threshold. False NULL condition threshold is a threshold value, 180-degrees or less, that ensures a false NULL condition does not occur, depending on specific operating conditions.

Figure 16:
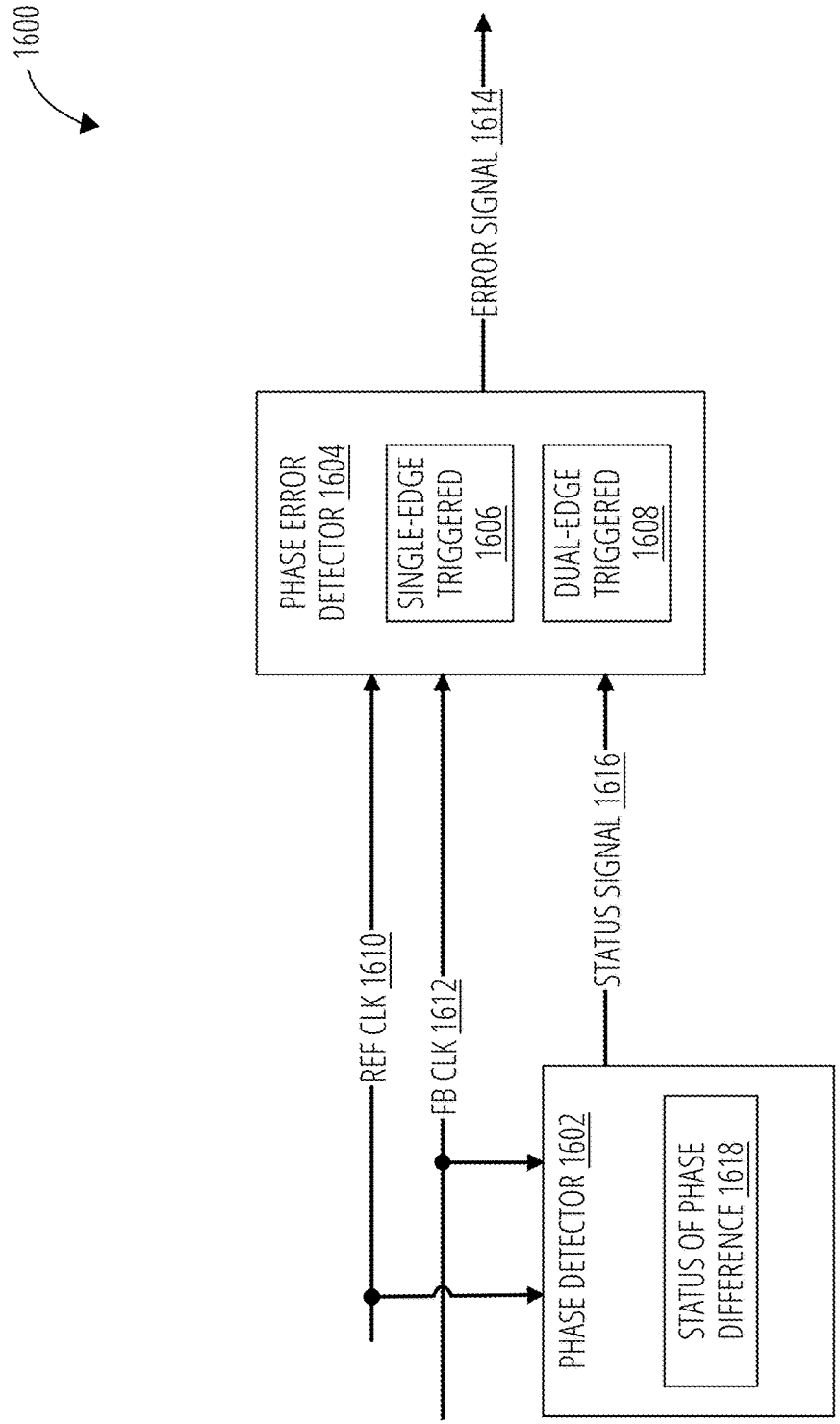
FIG. 16 is a block diagram depicting an apparatus that provides single and dual-edge phase error detection, in accordance with one or more examples.

FIG. 16 is a block diagram depicting an apparatus 1600 that provides single- and dual-edge-triggered phase error detection, in accordance with one or more examples.

Apparatus 1600 includes phase detector 1602 and a phase error detector 1604. The phase error detector 1604 may alternately be single-edge triggered 1606 or dual-edge triggered 1608.

Phase detector 1602 generates status signal 1616 at least partially responsive to two input signals, here, reference clock 1610 and feedback clock 1612. Phase detector 1602 determines a phase difference between reference clock 1610 and feedback clock 1612 and the status of the determined phase difference. Status signal 1616 indicates a status of phase difference 1618 between reference clock 1610 and feedback clock 1612.

Status of phase difference 1618 is a value that represents the instantaneous status of phase difference between reference clock 1610 and feedback clock 1612, or a set of sequential values that represent the continuous status of phase difference between reference clock 1610 and feedback clock 1612.

In one or more examples, that status of phase difference 1618 that phase detector 1602 detects is whether or not a phase relationship between reference clock 1610 and feedback clock 1612 is less than false NULL condition threshold, e.g., 180-degrees, optionally by some threshold amount, to avoid a false NULL condition. If phase detector 1602 determines that the phase relationship between reference clock 1610 and feedback clock 1612 is less than the false NULL condition threshold, then phase detector 1602 sets status signal 1616 to a first value. If phase detector 1602 determines that the phase relationship between reference clock 1610 and feedback clock 1612 greater than the false NULL condition threshold, then phase detector 1602 sets status signal 1616 to a second value, different than the first value.

Phase detector 1602 may change the value of status signal 1616 from a value indicating the phase relationship is less than 180-degrees to a value indicating not less than 180-degrees in response to a changing (i.e., increasing), phase difference between reference clock 1610 and feedback clock 1612. Thus, in one or more examples, status of phase difference 1618 and the state of status signal 1616 may change over time at least partially responsive to changes in the phase difference between reference clock 1610 and feedback clock 1612.

Phase error detector 1604 receives reference clock 1610, feedback clock 1612, and phase threshold status signal 1616, and generates error signal 1614 at least partially responsive thereto.

In one or more examples, phase error detector 1604 generates an error signal that is proportional to a phase difference between two input-selected signals (here, reference clock 1610 and feedback clock 1612). More specifically, the magnitude and direction of the phase error indicated in the error signal is proportional to the phase difference between the input-selected signals. If the phase and frequency of the two input-selected signals is substantially the same, the magnitude and direction information in the error signal will be zero, indicating that the phase and frequency of the two signals are the same. If there is a phase or frequency difference between the two input signals, then the magnitude and direction information in the error signal will be non-zero and proportional to the difference between the phase (and indirectly, the frequency) of the two input signals.

In one or more examples, phase error detector 1604 may be a binary phase detector that generates error signal 1614 as a binary signal having two separate and distinct component signals, an UP signal and a DOWN signal. Phase error detector 1604 generates the UP signal and the DOWN signal as a series of pulses, where pulses on respective ones of the UP signal and DOWN signal indicate the magnitude and direction of error. The one of the UP signal and the DOWN signal that first exhibits a pulse indicates which one of the two input-selected signals leads the other; and, conversely, which one of the two input-selected signals lags the other. The magnitude of error signal 1614 is represented by the pulse width of a pulse generated in the UP signal or DOWN signal. A larger pulse width indicating a larger phase difference between the two input signals, and a smaller pulse width indicating a smaller phase difference. One of the inputs of phase error detector 1604 is preset as the reference input that is led, lagged, or locked to, and the other one of the inputs of phase error detector 1604 is preset as the feedback (or "controlled") input that is leading, lagging, or locked on. As a non-limiting example, in a clock-tracking circuit the reference signal is provided to the reference input, and the output signal (or derivative thereof) is provided to the feedback input.

Phase error detector 1604 operates according to one of single-edge triggered 1606 or dual-edge triggered 1608.

While single-edge triggered 1606, phase error detector 1604 triggers (i.e., generates error signal 1614 responsive to) only on edges of reference clock 1610 and feedback clock 1612 having a first polarity, but not on edges having a second, different polarity. The edges having the first polarity may be one of rising edges or falling edges, and edges having the second polarity may be the other one of rising edges or falling edges. Single-edge triggered may also be referred to as "single-polarity edge triggered." While single-edge triggered 1606, the phase information about reference clock 1610 and feedback clock 1612 in error signal 1614 is based solely on edges of reference clock 1610 and feedback clock 1612 having the first polarity.

While dual-edge triggered 1608, phase error detector 1604 triggers (i.e., generates error signal 1614 responsive to) edges of reference clock 1610 and feedback clock 1612 having a first polarity and edges of reference clock 1610 and feedback clock 1612 having a second, different polarity. The edges having the first polarity may be one of rising edges or falling edges, and edges having the second polarity may be the other one of rising edges or falling edges. Dual-edge triggered may also be referred to as "dual-polarity edge triggered," where "dual-polarity" refers to the first polarity and the second, different polarity. While dual-edge triggered 1608, the phase information about reference clock 1610 and feedback clock 1612 in error signal 1614 is based on edges of reference clock 1610 and feedback clock 1612 having the first polarity and edges of reference clock 1610 and feedback clock 1612 having the second polarity.

Being single-edge triggered 1606 or dual-edge triggered 1608 is set at phase error detector 1604 at least partially in response to a value of status signal 1616. A first value of status signal 1616 indicates that the phase difference between reference clock 1610 and feedback clock 1612 is less than the false NULL condition threshold. A second value of status signal 1616 indicates that the phase difference between reference clock 1610 and feedback clock 1612 is greater than or equal to the false NULL condition threshold. In this manner, phase error detector 1604 may operate single-edge triggered 1606 while the phase difference between reference clock 1610 and feedback clock 1612 is greater than or equal to the false NULL condition threshold, and operate dual-edge triggered 1608 while the phase difference between reference clock 1610 and feedback clock 1612 is less than the false NULL condition threshold.

Edges fed into phase error detector 1604 when dual-edge triggered are converted the same polarity unless already that polarity. If an edge of feedback clock 1612 or reference clock 1610 has a different polarity, it is converted to the same polarity. The phase error detector 1604 could lock edges of feedback clock 1612 and reference clock 1610 having different polarities if the phase error was greater than or equal to 180-degrees. Limiting the phase error detection based on edges having a first polarity until the phase error is less than 180-degrees and then detecting phase error based on both of edges having first polarity and edges having a second polarity, ensures the false NULL conditions do not occur.

One or more examples relate, generally, to phase error detection that operates single-edge triggered until the phase-error between two input signals is less than 180 degrees and then operates dual-edge triggered. During single-edge mode, the phase error detection is at least partially based on un-converted versions of the input signals. During dual-edge mode, the phase error detection is at least partially based on converted versions of the input signals.

Examples reduce or eliminate the false NULL condition that would otherwise occur in the dual-edge mode PFD transfer function, and which might prevent the clock-tracking circuit from being locked at a suitably small phase error.

Figure 17:
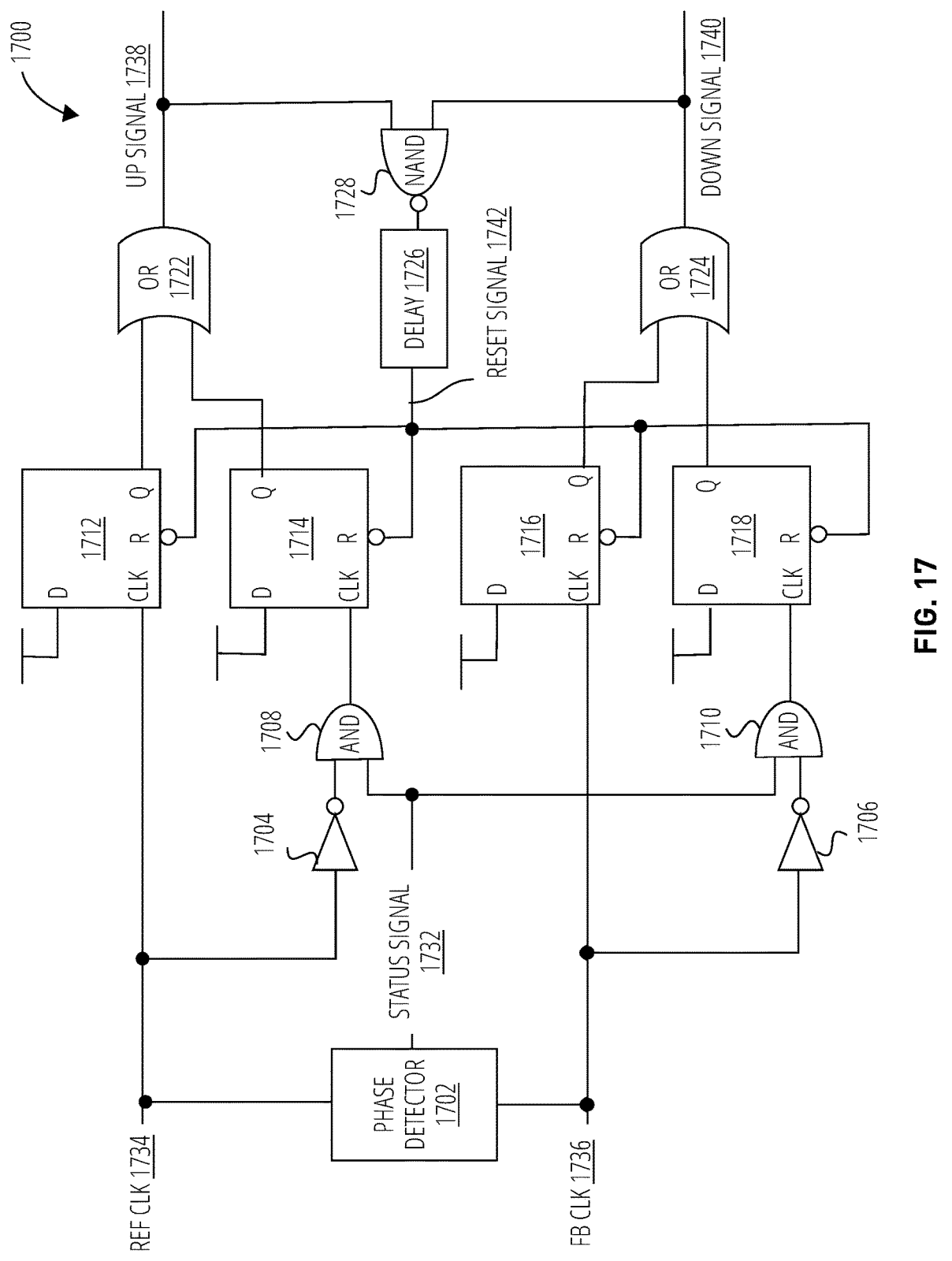

FIG. 17 is a block diagram depicting an apparatus 1700 that provides single- and dual-edge-triggered phase error detection, in accordance with one or more examples. Apparatus 1700 may also be referred to herein as a "phase error detector 1700."

Apparatus 1700 changes from single-edge lock detect to dual-edge lock detect, dynamically. Apparatus 1700 changes from single-edge lock detect in response to determining that the phase-error between two input signals is less than the false NULL condition threshold, here, 180-degrees.

Apparatus 1700 includes Phase detector 1702, an inverter 1704, an inverter 1706, an AND gate 1708, an AND gate 1710, a first flip-flop 1712, a second flip-flop 1714, a third flip-flop 1716, a fourth flip-flop 1718, an OR gate 1722, an OR gate 1724, a delay 1726, and a NAND gate 1728.

Phase detector 1702 is a non-limiting example of phase detector 1602 of FIG. 16 (status of phase difference 1618 is omitted solely to avoid unnecessarily cluttering FIG. 17). The remaining sequential logic circuit in FIG. 17 is a non-limiting example of phase error detector 1604 of FIG. 16, and UP signals 1738 and DOWN signal 1740 are examples of components error signals of error signal 1614.

Phase detector 1702 generates status signal 1732 at least partially responsive to two input signals, here, reference clock 1734 and feedback clock 1736. Phase detector 1702 may be, as a non-limiting example, phase detector 200 of FIG. 2 where the false NULL condition threshold is set to be 180 degrees. Status signal 104 indicates the phase relationship between reference clock 1734 and feedback clock 1736, namely, whether or not it is less than the false NULL condition threshold to ensure NULL conditions discussed above, do not occur. Phase detector 1702 determines whether or not a phase relationship between reference clock 1734 and feedback clock 1736 is less than 180-degrees, and sets status signal 1732 to a value based on the determination. In the specific non-limiting example depicted by FIG. 17, the set value of status signal 1732 is maintained unless/until the phase difference increases above the 180-degrees threshold. In other examples, it is specifically contemplated that the value of status signal 1732 does not change once set to indicate the phase difference is less than 180-degrees, unless/until the phase relationship increases above the 180-degrees threshold.

If phase detector 1702 determines that the phase difference is not less than 180-degrees, then phase detector 1702 sets the status signal 1732 to a value that indicates the same. In the specific non-limiting example depicted by FIG. 17, phase detector 1702 utilizes a high state or '1' to indicate the phase difference is less than 180-degrees and utilizes a low state or '0' to indicate that the phase difference is not less than 180-degrees. Other conventions may be utilized with minor circuit modifications to the apparatus 1700 that would be readily apparent to a person having ordinary skill in the art, and so use of other conventions does not exceed the scope of this disclosure.

First flip-flop 1712, second flip-flop 1714, third flip-flop 1716, and fourth flip-flop 1718 are edge-triggered flip-flops. Each flip-flop 202, 204, 220, and 224 has a Data (D) input, a clock (CLK) input and an output (Q).

When first flip-flop 1712, second flip-flop 1714, third flip-flop 1716, or fourth flip-flop 1718 is reset, its respective output (Q) is forced to low state (i.e., low state at the reset (R) input overrides the data (D) input and clock (CLK) input and forces output (Q) to low state). Respective reset (R) inputs of first flip-flop 1712, second flip-flop 1714, third flip-flop 1716, and fourth flip-flop 1718 are active low.

Delay 1726 is a delay circuit that introduces a predetermined amount of time delay to the propagation of a signal from its input to its output. In one or more examples, the predetermined amount of time delay introduced is equal to, or at least partially based on, a suitable time to allow components in a clock tracking circuit a minimum ON time so they can settle before the state of the output of phase error detector 1700 changes.

Respective data (D) inputs of first flip-flop 1712, second flip-flop 1714, third flip-flop 1716, and fourth flip-flop 1718 are coupled to a supply voltage to set the data (D) inputs to a high state. The clock (CLK) input of first flip-flop 1712 receives reference clock 1734, and the clock (CLK) input of third flip-flop 1716 receives feedback clock 1736. One of the inputs of OR gate 1722 receives the output (Q) of first flip-flop 1712, and one of the inputs of OR gate 1722 receives the output of second flip-flop 1714. The output of OR gate 1722 is provided as UP signal 1738. One of the inputs of OR gate 1724 receives the output (Q) of third flip-flop 1716, and one of the inputs of OR gate 1724 receives the output of fourth flip-flop OR gate 1724. The output of OR gate 1724 is provided as DOWN signal 1740.

An input of delay 1726 receives the output of NAND gate 1728. The respective reset (R) inputs of first flip-flop 1712 and third flip-flop 1716 receive the output of delay 1726, which is the delayed output of NAND gate 1728. The output of delay 1726 i.e., delayed output of NAND gate 1728, may also be referred to herein as a reset signal 1742. As long as at least one of the inputs of NAND gate 1728 is set to low state, its output is set to high state, which does not reset first flip-flop 1712 or third flip-flop 1716.

While the phase difference between reference clock 1734 and feedback clock 1736 is greater than or equal to 180-degrees, phase detector 1702 maintains the clock (CLK) inputs of second flip-flop 1714 and fourth flip-flop 1718 to low state via inverter 1704, AND gate 1708, inverter 1706 and AND gate 1710. While the clock (CLK) inputs are maintained at low state, the respective outputs (Q) of second flip-flop 1714 and fourth flip-flop 1718 do not change from the reset state and therefore are in the low state. This condition corresponds to setting apparatus 1700 to operate as single-edge triggered. When the phase difference between reference clock 1734 and feedback clock 1736 is less than 180-degrees, Phase detector 1702 sets apparatus 1700 to operate dual-edge triggered, as discussed below.

In single-edge mode, apparatus 1700 is rising-edge triggered. When one of reference clock 1734 or feedback clock 1736 changes from low state to high state (i.e., exhibits a rising edge), then the corresponding one of UP signal 1738 or DOWN signal 1740 change from low state to high state. When the other one of reference clock 1734 or feedback clock 1736 changes from low state to high state, then the other corresponding one of UP signal 1738 or DOWN signal 1740 changes from low state to high state. First flip-flop 1712 and third flip-flop 1716 are reset, after predetermined delay time provided by delay 1726, in response to both UP signal 1738 and DOWN signal 1740 having changed from low state to high state by the action of NAND gate 1728. Respective outputs (Q) of first flip-flop 1712 and third flip-flop 1716 are set to low state (forced to low state) in response to being reset. UP signal 1738 and DOWN signal 1740 change from high state to low state in response to the outputs (Q) of first flip-flop 1712 and third flip-flop 1716 changing from high state to low state. Upon the respective outputs (Q) of the flip-flops being forced to a low state, the reset signal 1742 changes from a high state to a low state due to the action of NAND gate 1728.

When the phase difference between reference clock 1734 and feedback clock 1736 is less than 180-degrees, phase detector 1702 enables dual-edge mode at apparatus 1700. Specifically, phase detector 1702 sets status signal 1732 to a high state and maintains the high state. One of the inputs of AND gate 1708 and AND gate 1710 is set to high state in response to status signal 1732 being set to high state. The other one of the inputs of AND gate 1708 and AND gate 1710 receives inverted reference clock 1734 via inverter 1704 and inverted feedback clock 1736 via inverter 1706, respectively. Maintaining one of the inputs of AND gate 1708 and AND gate 1710 at high state effectively sets the respective outputs of AND gate 1708 and AND gate 1710 to be responsive to reference clock 1734 and feedback clock 1736, respectively, and so sets respective clock (CLK) inputs second flip-flop 1714 and fourth flip-flop 1718 to be responsive to inverted reference clock 1734 and inverted feedback clock 1736, respectively. Setting respective clock (CLK) inputs of second flip-flop 1714 and fourth flip-flop 1718 to be responsive to inverted reference clock 1734 and feedback clock 1736 is effectively setting respective clock (CLK) inputs of second flip-flop 1714 and fourth flip-flop 1718 to be responsive to falling edges of reference clock 1734 and feedback clock 1736. So, when one of reference clock 1734 or feedback clock 1736 changes from high state to low state (i.e., exhibits a falling edge), the corresponding one of second flip-flop 1714 or fourth flip-flop 1718 is triggered, and its output (Q) changes from low state to high state.

In dual-edge mode, rising edge triggering is performed the same as in single-edge mode, discussed above. For falling-edge triggering, when one of reference clock 1734 or feedback clock 1736 changes from high state to low state (i.e., exhibits a falling edge), then the corresponding one of UP signal 1738 or DOWN signal 1740 changes from low state to high state through the respective one of OR gate 1722 and OR gate 1724. When the other one of reference clock 1734 or feedback clock 1736 changes from high state to logic low, then the other corresponding one of UP signal 1738 or DOWN signal 1740 changes from low state to high state. First flip-flop 1712 and third flip-flop 1716 are reset, after the predetermined delay time provided by delay 1726, in response to both UP signal 1738 and DOWN signal 1740 having changed from low state to high state, due to the action of NAND gate 1728. Respective outputs (Q) of second flip-flop 1714 and fourth flip-flop 1718 are set to low state (forced to low state) in response to being reset. UP signal 1738 and DOWN signal 1740 change from high state to low state in response to the outputs (Q) of first flip-flop 1712 and third flip-flop 1716 changing from high state to low state.

Figure 18:
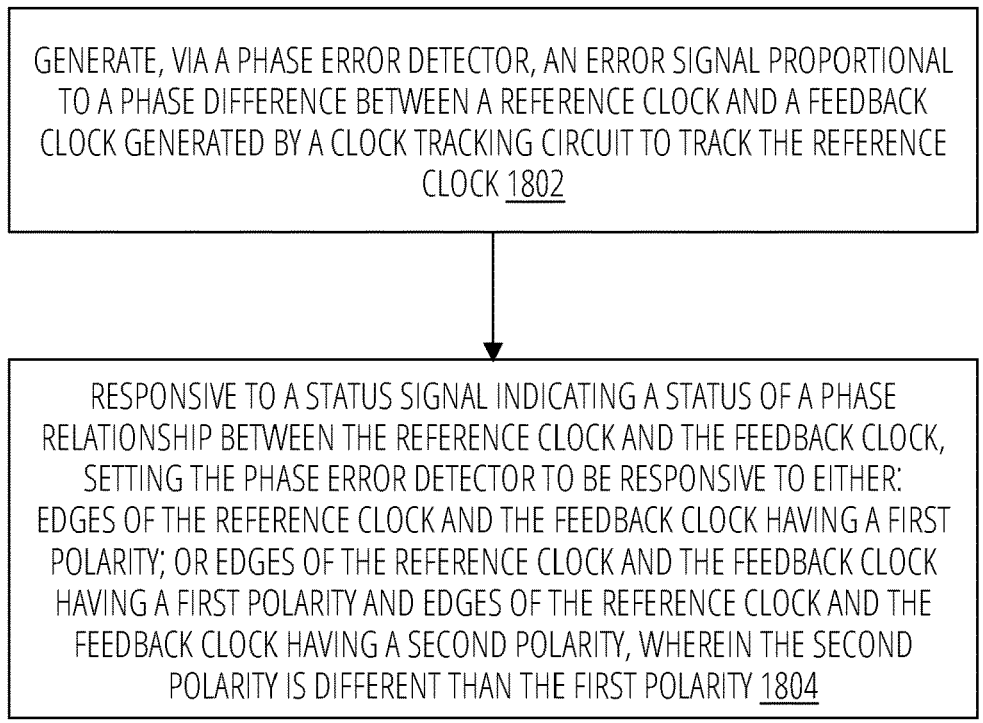
FIG. 18 is a flow diagram depicting a process for improved dual-edge phase error detection, in accordance with one or more examples.

FIG. 18 is a flow diagram depicting a process 1800 for improved dual-edge detection, in accordance with one or more examples. Some or a totality of operations of process 1800 may be performed by, as a non-limiting example, by apparatus 1600 or phase error detector 1604, phase error detector 1700.

Although the example process 1800 depicts a particular sequence of operations, the sequence may be altered without departing from the scope of the present disclosure. For example, some of the operations depicted may be performed in parallel or in a different sequence that does not materially affect the function of the process 1800. In other examples, different components of an example device or system that implements the process 1800 may perform functions at substantially the same time or in a specific sequence.

According to one or more examples, the method includes generating, via a phase error detector, an error signal proportional to a phase difference between a reference clock and a feedback clock generated by a clock tracking circuit to track the reference clock at operation 1802.

According to one or more examples, the method includes responsive to a status signal indicate status of phase difference between the reference clock and the feedback clock, setting the phase error detector to be responsive to either.

Edges of the reference clock and the feedback clock having a first polarity; or Edges of the reference clock and the feedback clock having a first polarity and edges of the reference clock and the feedback clock having a second polarity, wherein the second polarity is different than the first polarity at operation 1804.

Figure 19:
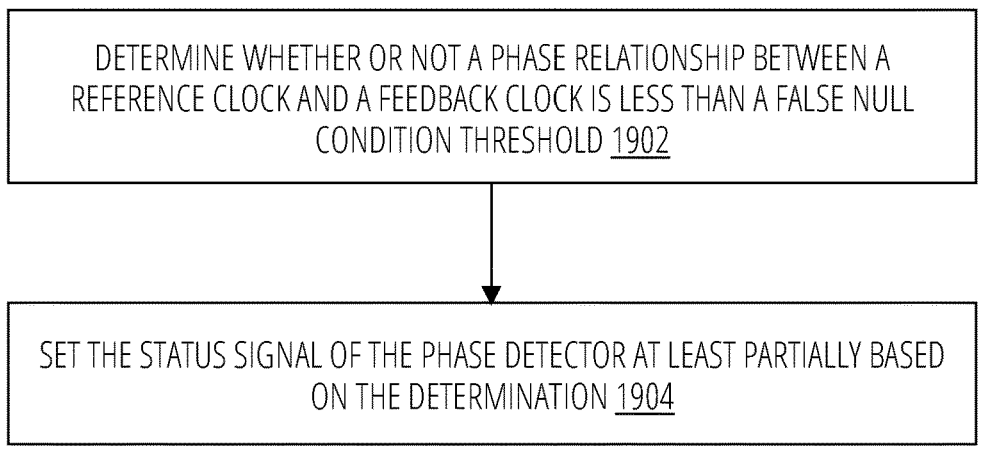
FIG. 19 is a flow diagram depicting a process for setting a status signal to indicate status of phase difference between a reference clock and a feedback clock, in accordance with one or more examples.

FIG. 19 is a flow diagram depicting a process 1900 for setting a status signal to indicate status of phase difference between a reference clock and a feedback clock, in accordance with one or more examples. Some or a totality of operations of process 1900 may be performed by, as a non-limiting example, by apparatus 1600 or phase detector 1602.

Although the example process 1900 depicts a particular sequence of operations, the sequence may be altered without departing from the scope of the present disclosure. For example, some of the operations depicted may be performed in parallel or in a different sequence that does not materially affect the function of the process 1900. In other examples, different components of an example device or system that implements the process 1900 may perform functions at substantially the same time or in a specific sequence.

According to one or more examples, the method includes determining a respective status of phase difference between the reference clock and the feedback clock at operation 1902.

According to one or more examples, the method includes setting the status signal to indicate the determined respective status of phase difference at operation 1904.

Figure 20:
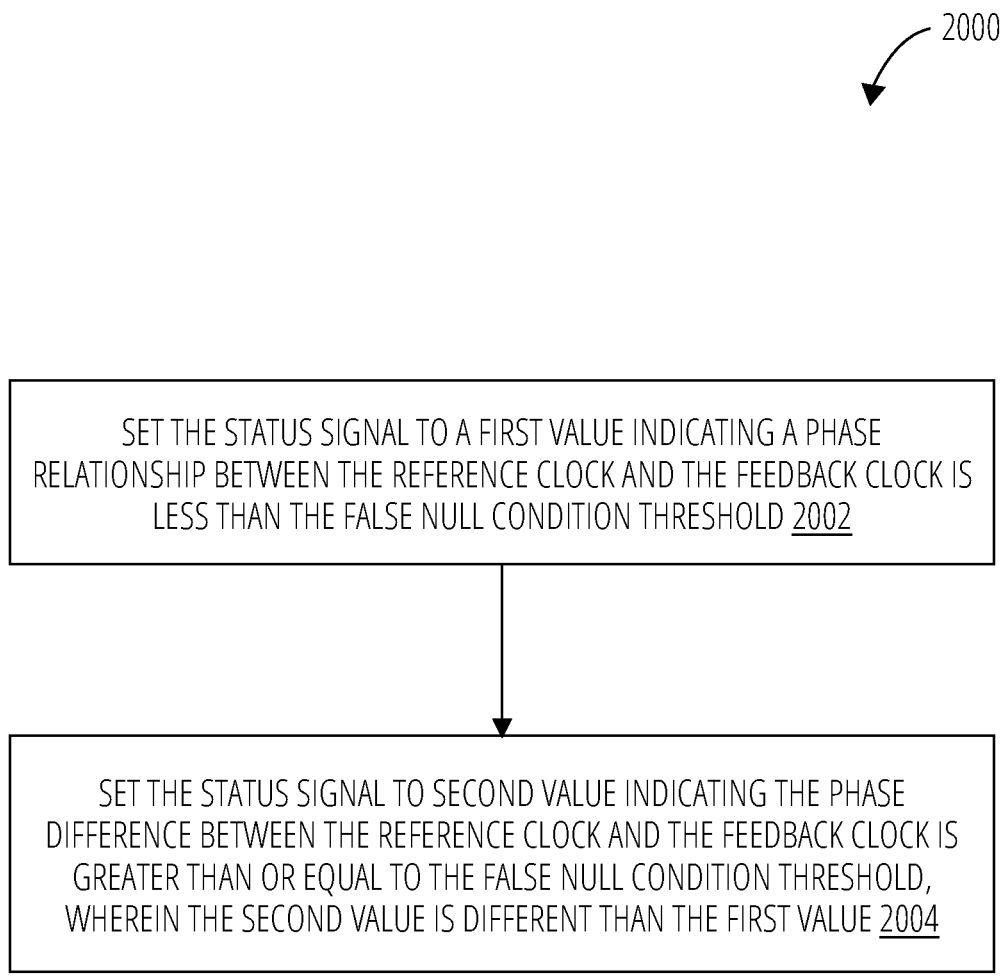
FIG. 20 is a flow diagram depicting a process for setting a status signal to indicate status of phase difference between a reference clock and a feedback clock, in accordance with one or more examples.

FIG. 20 is a flow diagram depicting a process 2000 for setting a status signal to indicate status of phase difference between a reference clock and a feedback clock, in accordance with one or more examples. Some or a totality of operations of process 2000 may be performed by, as a non-limiting example, by apparatus 1600 or phase detector 1602.

Although the example process 2000 depicts a particular sequence of operations, the sequence may be altered without departing from the scope of the present disclosure. For example, some of the operations depicted may be performed in parallel or in a different sequence that does not materially affect the function of the process 2000. In other examples, different components of an example device or system that implements the process 2000 may perform functions at substantially the same time or in a specific sequence.

According to one or more examples, the method includes setting the status signal to a first value to indicate a phase difference between the reference clock and the feedback clock is less than a false NULL condition threshold at operation 2002.

According to one or more examples, the method includes setting the status signal to second value to indicate the phase difference between the reference clock and the feedback clock is greater than or equal to the false NULL condition threshold, wherein the second value is different than the first value at operation 2004.

Figure 21:
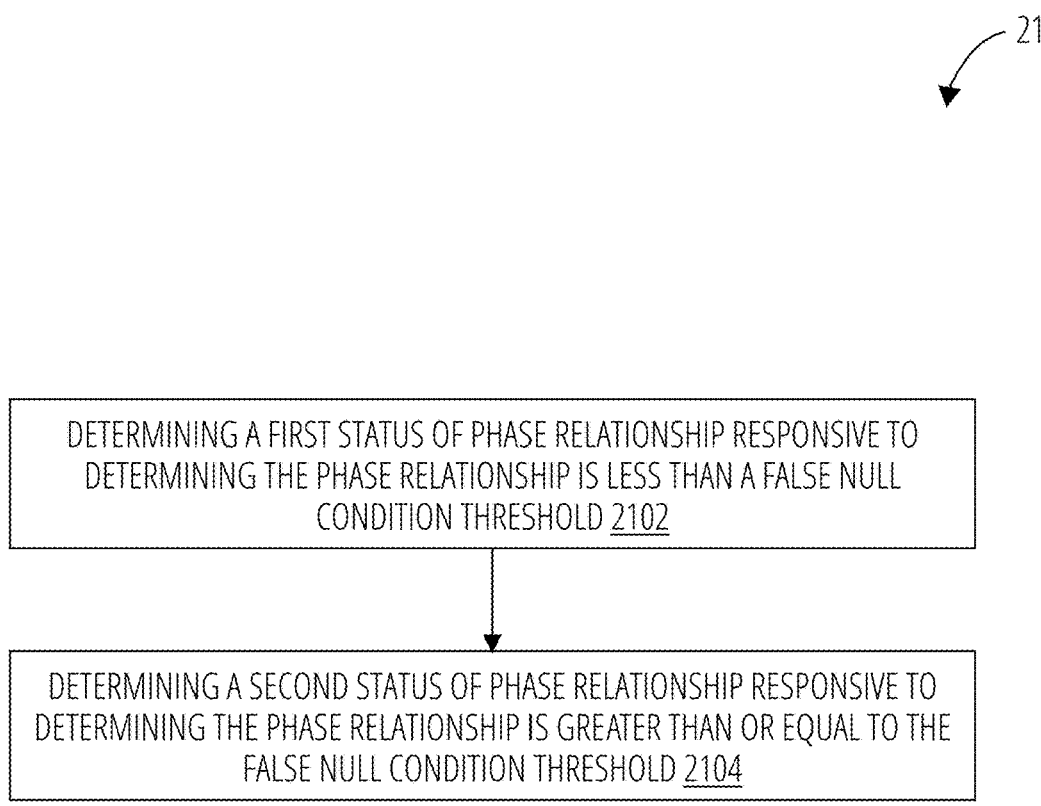
FIG. 21 is a flow diagram depicting a process for determining a status of phase difference between a reference clock and a feedback clock, in accordance with one or more examples.

FIG. 21 is a flow diagram depicting a process 2100 for determining a status of phase difference between a reference clock and a feedback clock, in accordance with one or more examples. Some or a totality of operations of process 2100 may be performed by, as a non-limiting example, by apparatus 1600 or phase detector 1602.

Although the example process 2100 depicts a particular sequence of operations, the sequence may be altered without departing from the scope of the present disclosure. For example, some of the operations depicted may be performed in parallel or in a different sequence that does not materially affect the function of the process 2100. In other examples, different components of an example device or system that implements the process 2100 may perform functions at substantially the same time or in a specific sequence.

According to one or more examples, the method includes determining a first status of phase relationship responsive to determining the phase relationship being less than a false NULL condition threshold at operation 2102.

According to one or more examples, the method includes determining a second status of phase relationship responsive to determining the phase relationship is greater than or equal to the false NULL condition threshold at operation 2104.

Figure 22:
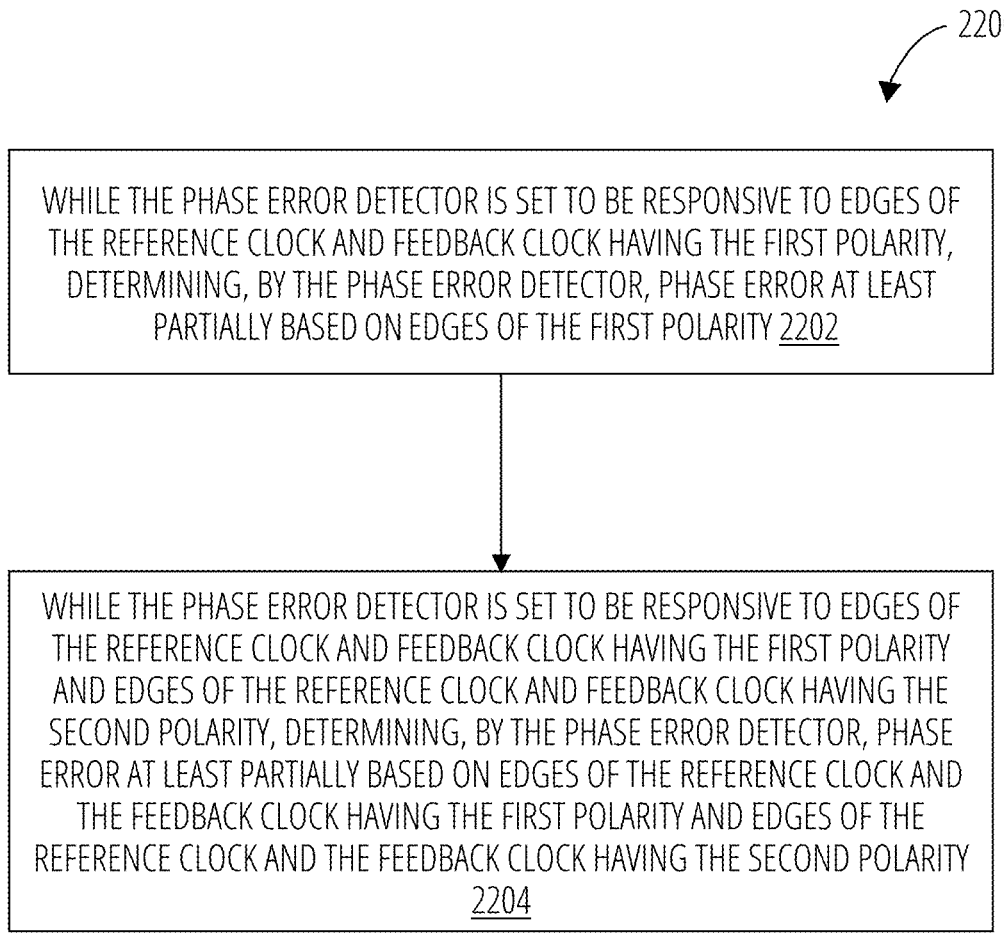
FIG. 22 is a flow diagram depicting a process for determining phase error, in accordance with one or more examples.

FIG. 22 is a flow diagram depicting a process 2200 for determining phase error, in accordance with one or more examples. Some or a totality of operations of process 2200 may be performed by, as a non-limiting example, by apparatus 1600 or phase error detector 1604.

Although the example process 2200 depicts a particular sequence of operations, the sequence may be altered without departing from the scope of the present disclosure. For example, some of the operations depicted may be performed in parallel or in a different sequence that does not materially affect the function of the process 2200. In other examples, different components of an example device or system that implements the process 2200 may perform functions at substantially the same time or in a specific sequence.

According to one or more examples, the method includes while the phase error detector is set to be responsive to edges of the reference clock and feedback clock having the first polarity, determining, by the phase error detector, phase error at least partially based edges of the first polarity. at operation 2202.

According to one or more examples, the method includes whiling the phase error detector is set to be responsive to edges of the reference clock and feedback clock having the first polarity and edges of the reference clock and feedback clock having the second polarity, determining, by the phase error detector, phase error at least partially based on edges of the reference clock and the feedback clock having the first polarity and edges of the reference clock and the feedback clock having the second polarity at operation 2204.

Figure 23:
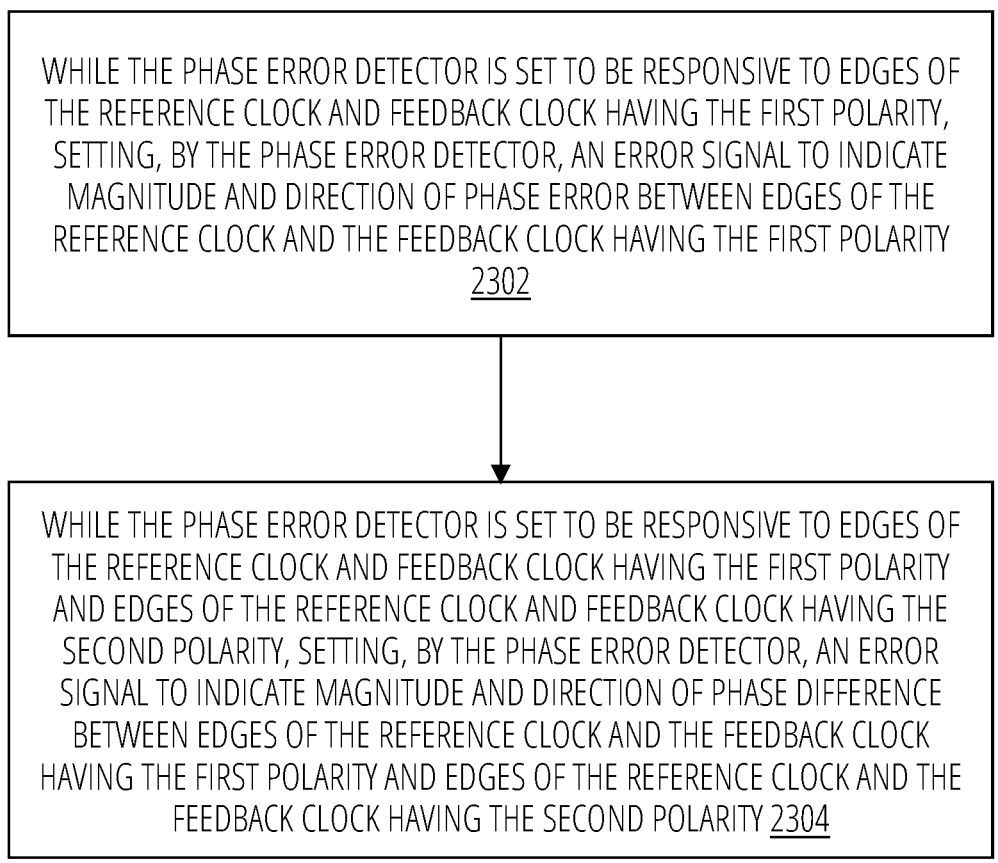
FIG. 23 is a flow diagram depicting a process for setting a phase error signal to indicate magnitude and direction of phase difference between a reference clock and a feedback clock, in accordance with one or more examples.

FIG. 23 is a flow diagram depicting a process 2300 for setting a phase error signal to indicate magnitude and direction of phase difference between a reference clock and a feedback clock, in accordance with one or more examples. Some or a totality of operations of process 2200 may be performed by, as a non-limiting example, by apparatus 1600 or phase error detector 1604.

Although the example process 2300 depicts a particular sequence of operations, the sequence may be altered without departing from the scope of the present disclosure. For example, some of the operations depicted may be performed in parallel or in a different sequence that does not materially affect the function of the process 2300. In other examples, different components of an example device or system that implements the process 2300 may perform functions at substantially the same time or in a specific sequence.

According to one or more examples, the method includes whiling the phase error detector is set to be responsive to edges of the reference clock and feedback clock having the first polarity, setting, by the phase error detector, an error signal (e.g., error signal 1614 of FIG. 16, or UP signal 1738 and DOWN signal 1740 of FIG. 17, without limitation) to indicate magnitude and direction of phase error between edges of the reference clock and the feedback clock having the first polarity, at operation 2302.

According to one or more examples, the method includes while the phase error detector is set to be responsive to edges of the reference clock and feedback clock having the first polarity and edges of the reference clock and feedback clock having the second polarity, setting, by the phase error detector, an error signal (e.g., error signal 1614 of FIG. 16, or UP signal 1738 and DOWN signal 1740 of FIG. 17, without limitation) to indicate magnitude and direction of phase difference between edges of the reference clock and the feedback clock having the first polarity and edges of the reference clock and the feedback clock having the second polarity at operation 2304.

Figure 24:
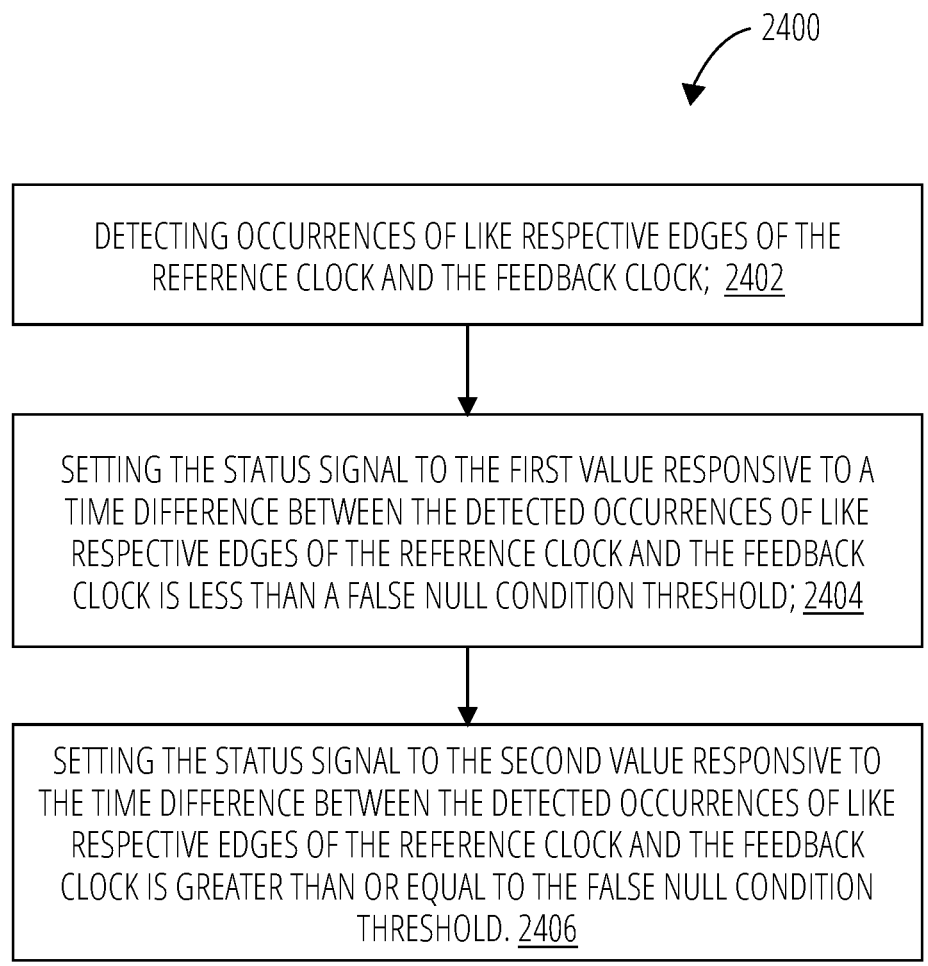
FIG. 24 illustrates an example 2400 for setting a status signal to indicate a status of phase relationship between a reference clock and a feedback clock based on a false NULL condition threshold, in accordance with one or more examples.

FIG. 24 illustrates an example 2400 for setting a status signal to indicate a status of phase relationship between a reference clock and a feedback clock based on a false NULL condition threshold, in accordance with one or more examples.

Although the example 2400 depicts a particular sequence of operations, the sequence may be altered without departing from the scope of the present disclosure. For example, some of the operations depicted may be performed in parallel or in a different sequence that does not materially affect the function of the 2400. In other examples, different components of an example device or system that implements the 2400 may perform functions at substantially the same time or in a specific sequence.

According to some examples, the method includes detecting occurrences of like respective edges of the reference clock and the feedback clock at operation 2402.

According to some examples, the method includes setting the status signal to the first value responsive to a time difference between the detected occurrences of like respective edges of the reference clock and the feedback clock is less than a false NULL condition threshold at block 2404.

According to some examples, the method includes setting the status signal to the second value responsive to the time difference between the detected occurrences of like respective edges of the reference clock and the feedback clock is greater than or equal to the false NULL condition threshold at block 2406.

Figure 25:
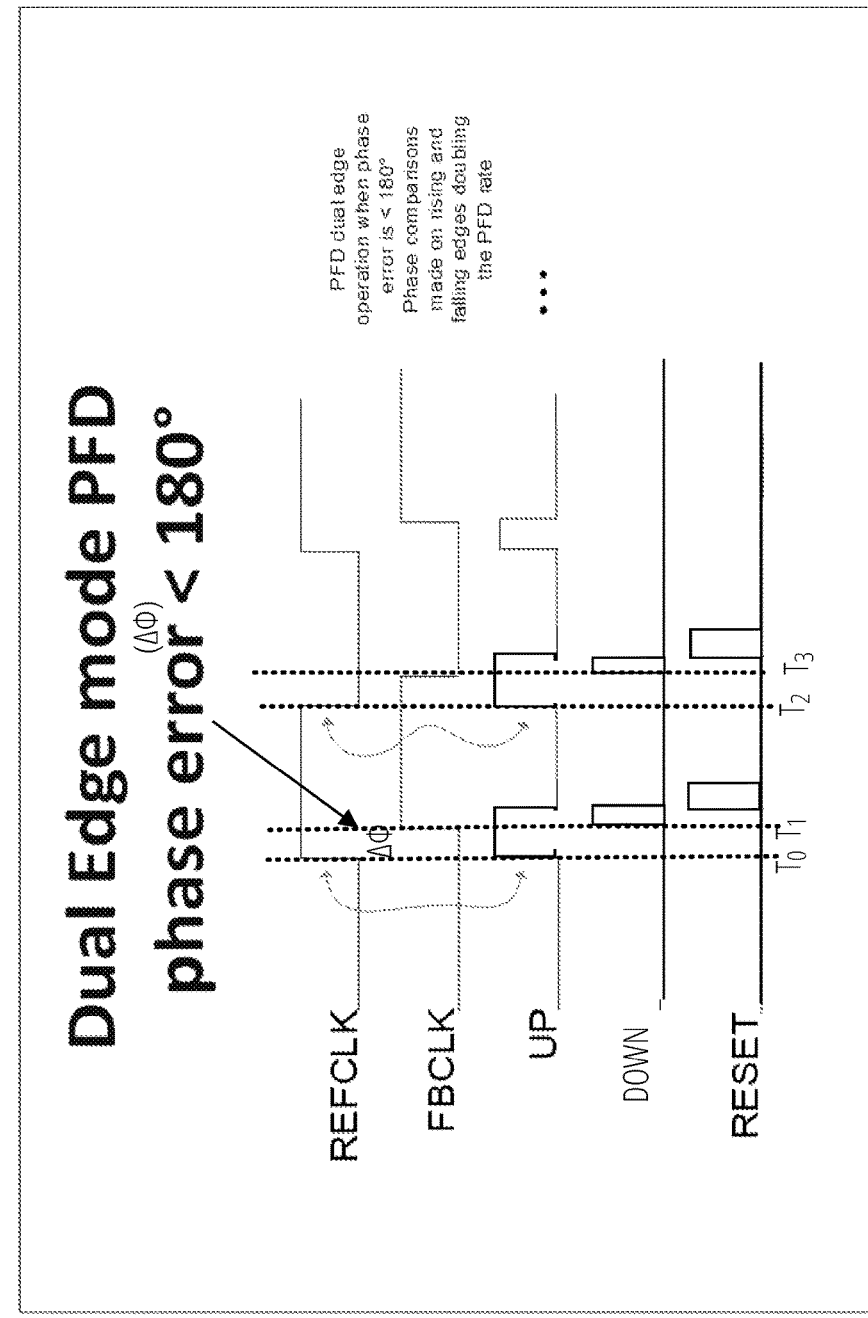
FIG. 25 is a timing diagram depicting an example operation of a dual-edge PFD such as the apparatus depicted by FIG. 17.

FIG. 25 is a timing diagram 2500 depicting an example operation of a dual-edge PFD such as apparatus 1700, without limitation.

Timing diagram 2500 includes waveforms for signals reference clock 1734, feedback clock 1736, UP signal 1738, DOWN signal 1740, and reset signal 1742. The waveforms depict an example with small phase difference (Δϕ).

At time $T_0$, UP signal 1738 is asserted (causing a rising edge) in response to a rising edge of reference clock 1734.

At time $T_1$, the DOWN signal 1740 is asserted (causing a rising edge) in response to a rising edge of feedback clock 1736.

At time $T_1$ (plus an optional delay due to delay 1726 but not shown in FIG. 18), in response to rising edges UP signal 1738 and DOWN signal 1740, and both being high state, reset signal 1742 is asserted (causing a rising edge), maintained at a high state for a predetermined time duration, and then de-asserted (causing a falling edge). Notably, in the example apparatus 1700 of FIG. 17, reset signal 1742 is active low (as discussed above with respect to the reset (R) inputs of respective flip-flops of apparatus 1700 of FIG. 17), nevertheless FIG. 25 depicts a pulse (low state to high state, and then high state to low state) for ease of description. Any convention may be used without exceeding the scope (e.g., active low or active high).

At time $T_1$+the predetermined time duration (during which UP signal 1738 and DOWN signal 1740 are maintained in a high state), the UP signal 1738 and the DOWN signal 1740 are both de-asserted (causing respective falling edges) in response to the assertion of the reset signal 1742.

From time $T_o$ to time $T_1$, phase frequency detector PFD phase comparison is made between reference clock 1734 and feedback clock 1736 utilizing the timing of their respective rising edges, and the phase detector PFD determines the phase difference (Δϕ) is less than 180-degrees and asserts status signal 1732 (status signal 1732 is not depicted by FIG. 25). Asserting status signal 1732 enables dual-edge detection, and more specifically, triggering on both rising and falling edges of reference clock 1734 and feedback clock 1736.

At time $T_2$, UP signal 1738 is asserted (causing a rising edge) in response to a falling edge of reference clock 1734.

At time $T_3$, the DOWN signal 1740 is asserted (causing a rising edge) in response to a falling edge of feedback clock 1736.

At time $T_3$+a predetermined time duration, in response to falling edges of UP signal 1738 and DOWN signal 1740 and both being low state, reset signal 1742 is asserted (causing a rising edge), maintained at a high state for a predetermined time duration, and then de-asserted (causing a falling edge).

At time $T_3$+the predetermined time duration (during which UP signal 1738 and DOWN signal 1740 are maintained in a high state), the UP signal 1738 and the DOWN signal 1740 are both de-asserted (causing respective falling edges) in response to the assertion of the reset signal 1742.

Figure 26:
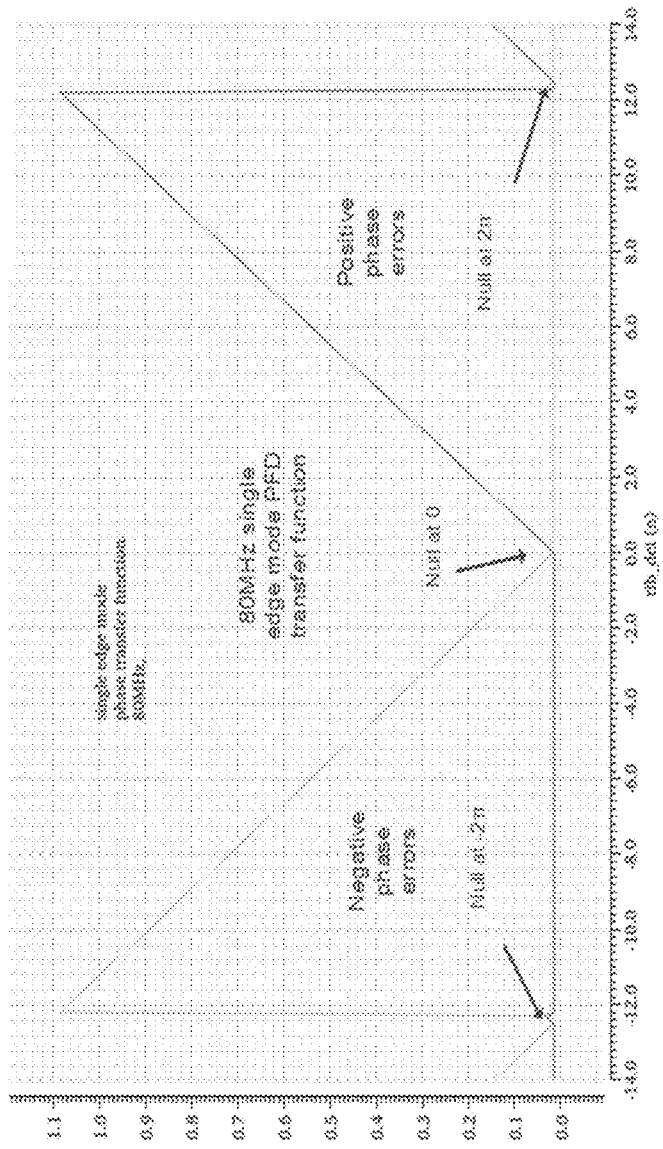
FIG. 26 is a graph of a simulation plot that shows a single-edge mode phase-frequency detector transfer function which only exhibits a NULL condition at 0° and therefore always aligns rising edges to rising edges.

FIG. 26 is a graph 2600 of a simulation plot that shows a curve representing a single-edge mode PFD transfer function of a phase error detector in accordance with one or more examples. The PFD exhibits a NULL condition only at 0-degrees but not 180-degrees and therefore always aligns rising edges to rising edges.

Figure 27:
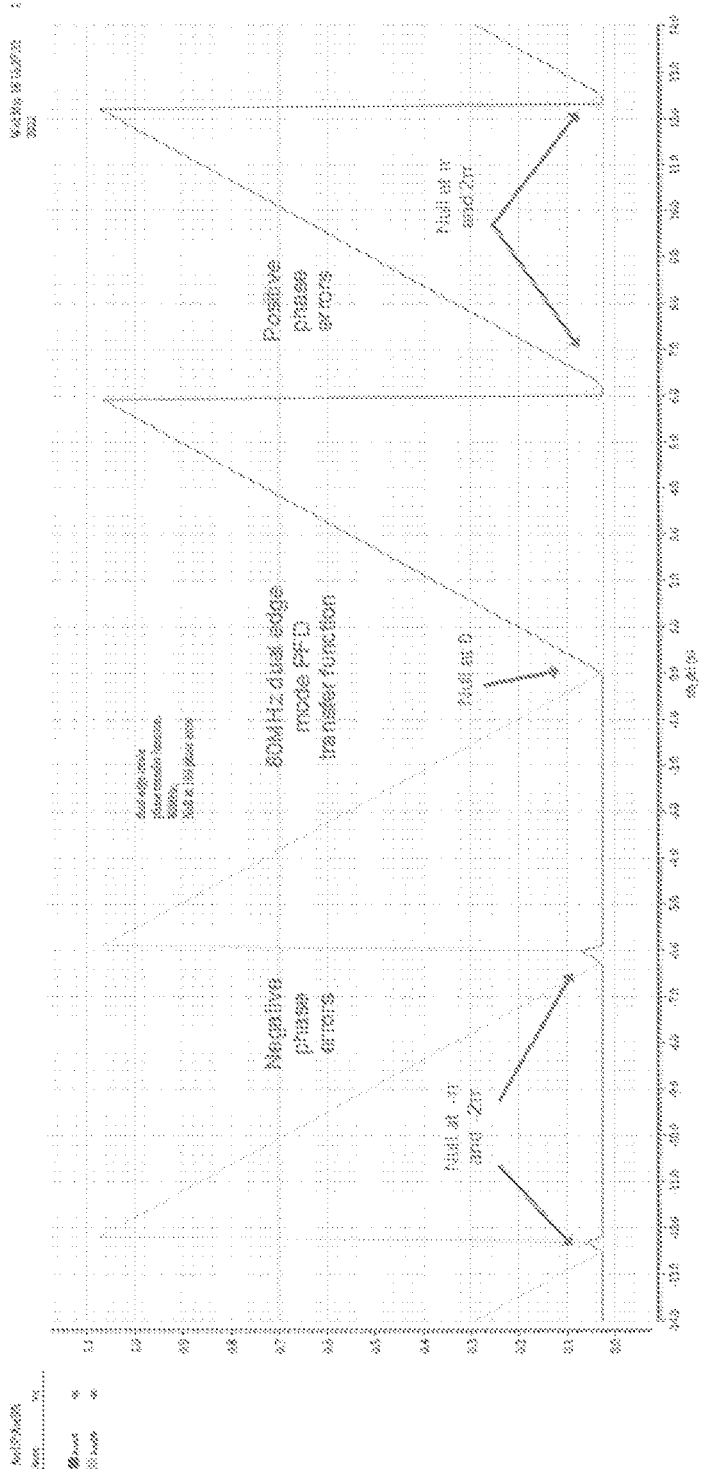
FIG. 27 is a graph of a simulation plot that shows a nominal dual-edge mode PFD transfer function that exhibits a false NULL condition at 180° and a desirable NULL condition at 0°.

FIG. 27 is a graph 2700 of a simulation plot that shows a curve representing a nominal dual-edge mode PFD transfer function which has an undesirable NULL at 180-degrees and a desirable NULL at 0-degrees. The false NULL condition at 180-degrees allows the clock tracking circuit to phase lock to opposite edges and increases mismatch and reference spurs.

Figure 28:
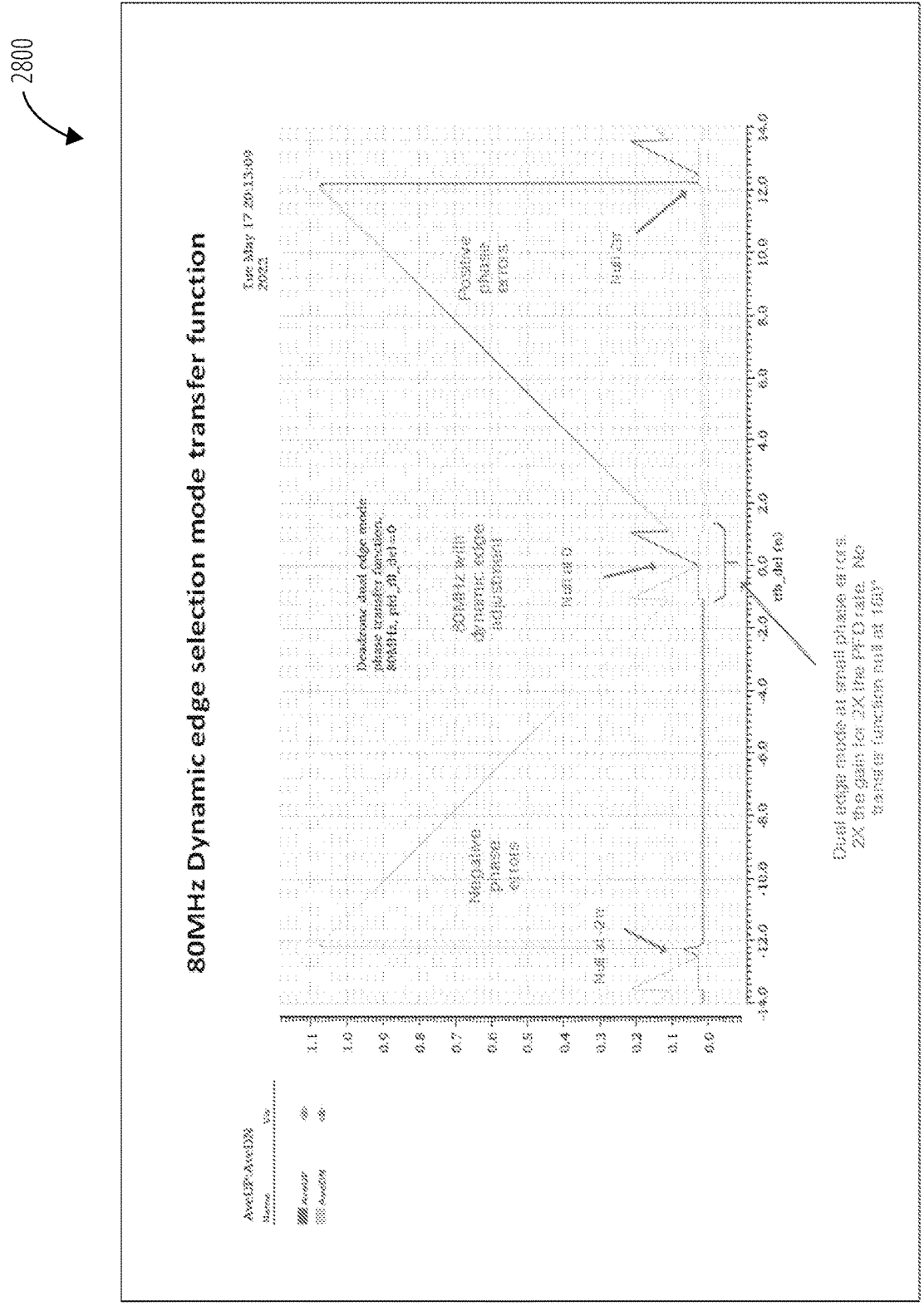
FIG. 28 is a graph of a simulation plot that shows a curve representing a dynamic dual-edge triggered transfer function.

FIG. 28 is a graph 2800 of a simulation plot that shows a curve that represents the dynamic dual-edge mode transfer function. There is no longer a NULL condition at 180-degrees. Hence, the PFD will push the PLL to lock rising edge to rising edge as in the single-edge mode case. When the phase error is small dual-edge mode is enabled resulting in a 2× transfer curve gain (triggered on both rising and falling edges instead of only one of rising edges or falling edges) just and a doubling of the PFD rate. The portions of the curve exhibiting 2× the slope correspond to the circuit operating in dual edge mode with 2× the gain (for that range of phase error). Negative phase error refers to the case where the feedback clock leads to the reference clock. Positive phase error refers to the case where the feedback clock lags the reference clock.

Figure 29:
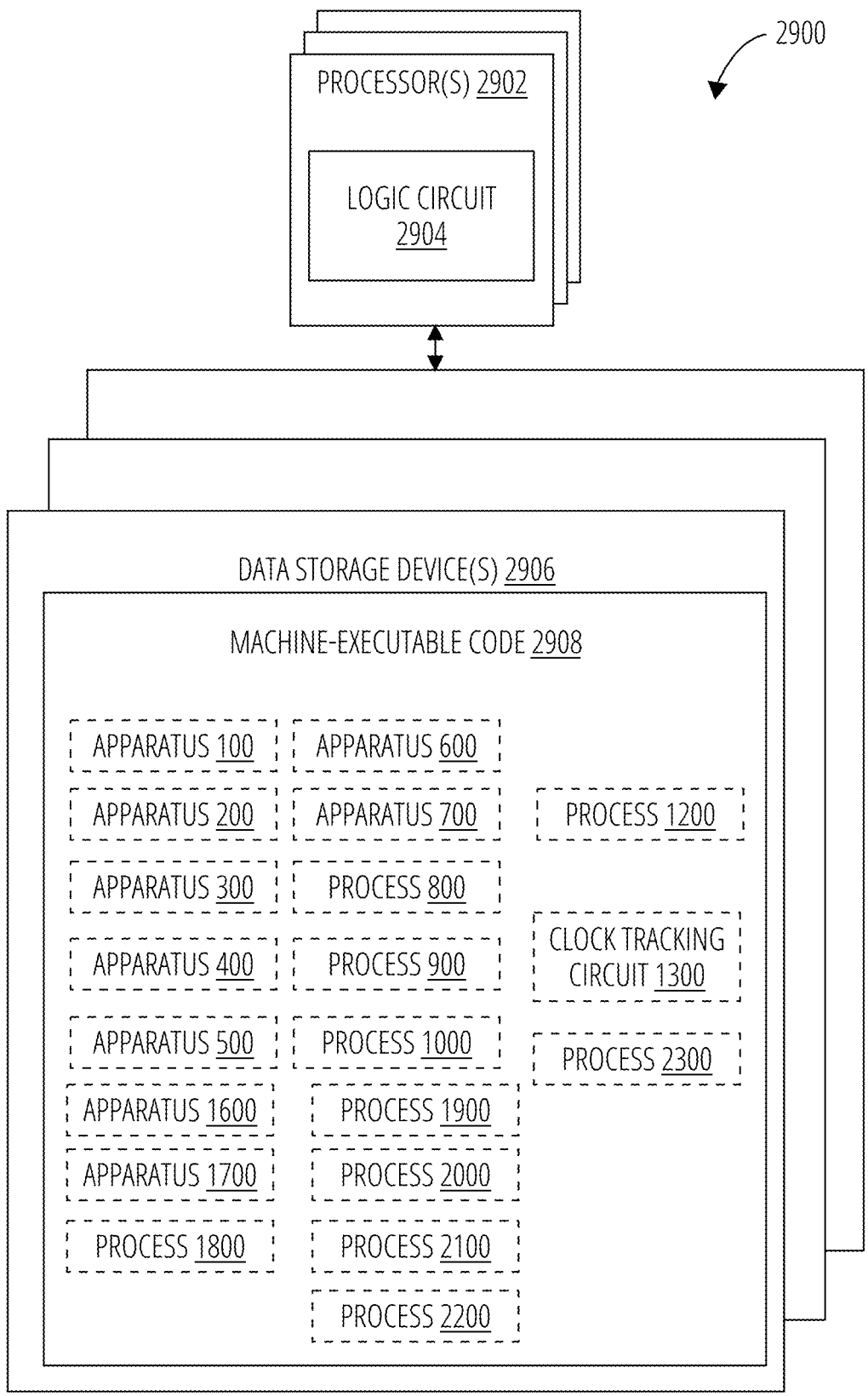
FIG. 29 is a block diagram of a circuitry that, in some examples, may be used to implement various functions, operations, acts, processes, or methods disclosed herein.

It will be appreciated by those of ordinary skill in the art that functional elements of examples disclosed herein (e.g., functions, operations, acts, processes, or methods) may be implemented in any suitable hardware, software, firmware, or combinations thereof. FIG. 29 illustrates non-limiting examples of implementations of functional elements disclosed herein. In some examples, some or all portions of the functional elements disclosed herein may be performed by hardware capable of carrying out the functional elements.

FIG. 29 is a block diagram of a circuitry 2900 that, in some examples, may be used to implement various functions, operations, acts, processes, or methods disclosed herein. The circuitry 2900 includes one or more processors processor(s) 2902 (sometimes referred to herein as "processor(s) 2902") operably coupled to one or more data storage devices storage 2906 (sometimes referred to herein as "storage 2906"). The storage 2906 includes machine-executable code 2908 stored thereon and the processor(s) 2902 include logic circuit 2904. The machine-executable code 2908 information describing functional elements that may be implemented by (e.g., performed by) the logic circuit 2904. The logic circuit 2904 is adapted to implement (e.g., perform) the functional elements described by the machine-executable code 2908. The circuitry 2900, when executing the functional elements described by the machine-executable code 2908, should be considered as special purpose hardware for carrying out functional elements disclosed herein. In some examples, the processor(s) 2902 may perform the functional elements described by the machine-executable code logic circuit 2904 sequentially, concurrently (e.g., on one or more different hardware platforms), or in one or more parallel process streams.

When implemented by logic circuit machine-executable code 2908 of the processor(s) 2902, the machine-executable code 2908 adapts the processor(s) 2902 to perform operations of examples disclosed herein, including, for example, determining a locked status of a clock tracking circuit. By way of non-limiting example, the machine-executable code 2908 may adapt the processor(s) 2902 to perform some or a totality of operations of one or more of: process 800, process 900, process 1000, process 1100, or process 1200.

Also, by way of non-limiting example, the machine-executable code 2908 may adapt the processor(s) 2902 to perform some or a totality of features, functions, or operations disclosed herein for one or more of: apparatus 100, apparatus 200, apparatus 300, apparatus 400, apparatus 500, apparatus 600, apparatus 700. More specifically, features, functions, or operations disclosed herein for one or more of: phase detector 102, a digital discriminator 106, and a logic circuit 112 of FIG. 1; apparatus 200 includes first flip-flop 202, a second flip-flop 204, third flip-flop 220, a fourth flip-flop 218. a first delay circuit 208, a second delay circuit 222, a NAND gate 206, and a NOR gate 210 of FIG. 2; and digital filter 302 and register 304; accumulation register 402, comparator 404, sampling clock divider 502, sampling logic circuit 602, interpolator 604, decimator 606, multiplexer 612, clock tracking circuit 1300, error detector 1302, controller 1304, controlled-oscillator 1306, or locked status detector 1318.

When implemented by logic circuit machine-executable code 2908 of the processors processor(s) 2902, the machine-executable code 2908 adapts the processor(s) 2902 to perform operations of examples disclosed herein, including for dual edge triggered phase error detection. By way of non-limiting example, the machine-executable code 2908 may adapt the processor(s) 2902 to perform some or a totality of operations of one or more of: process 1800, process 1900, process 2000, process 2100, process 2200, process 2300, 2400, timing diagram 2500, graph 2600, graph 2700, or graph 2800.

Also, by way of non-limiting example, the machine-executable code 2908 may adapt the processors processor(s) 2902 to perform some or a totality of features, functions, or operations disclosed herein for one or more of: apparatus 1600 and apparatus 1700. More specifically, features, functions, or operations disclosed herein for one or more of: phase detector 1602, phase error detector 1604, single-edge triggered 1606, dual-edge triggered 1608; phase detector 1702, inverter 1704, inverter 1706, AND gate 1708, AND gate 1710, first flip-flop 1712, second flip-flop 1714, third flip-flop 1716, fourth flip-flop 1718, OR gate 1722, OR gate 1724, delay 1726, NAND gate 1728.

The processors processor(s) 2902 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer executes functional elements corresponding to the machine-executable code 2908 (e.g., software code, firmware code, hardware descriptions) related to examples of the present disclosure. It is noted that a general-purpose processor (may also be referred to herein as a host processor or simply a host) may be a microprocessor, but in the alternative, the processors 502 may include any conventional processor, controller, microcontroller, or state machine. The processor(s) 2902 may also be implemented as a combination of computing devices, such as a combination of a DSP and a microprocessor, a plurality of microprocessors, one or more microprocessors in conjunction with a DSP core, or any other such configuration.

In some examples the storage 2906 includes volatile data storage (e.g., random-access memory (RAM)), non-volatile data storage (e.g., Flash memory, a hard disc drive, a solid-state drive, erasable programmable read-only memory (EPROM), without limitation). In some examples the processor(s) 2902 and the storage 2906 may be implemented into a single device (e.g., a semiconductor device product, a system on chip (SOC), without limitation). In some examples the processor(s) 2902 and the storage 2906 may be implemented into separate devices.

In some examples, the machine-executable code 2908 may include computer-readable instructions (e.g., software code, firmware code). By way of non-limiting example, the computer-readable instructions may be stored by the storage 2906, accessed directly by the processor(s) 2902, and executed by the processor(s) 2902 using at least the logic circuit 2904. Also, by way of non-limiting example, the computer-readable instructions may be stored on the storage 2906, transferred to a memory device (not shown) for execution, and executed by the processors 502 using at least the logic circuit 2904. Accordingly, in some examples the logic circuit 508 includes electrically configurable logic circuit 2904.

In some examples, the machine-executable code 2908 may describe hardware (e.g., circuitry) to be implemented in the logic circuit 2904 to perform the functional elements. This hardware may be described at any of a variety of levels of abstraction, from low-level transistor layouts to high-level description languages. At a high level of abstraction, a hardware description language (HDL) such as an IEEE Standard hardware description language (HDL) may be used. By way of non-limiting examples, Verilog™, System-Verilog™ or very large-scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuit 2904 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples, the machine-executable code 2908 may include an HDL, an RTL, a GL description, a mask level description, other hardware description, or any combination thereof.

In examples where the machine-executable code 2908 includes a hardware description (at any level of abstraction), a system (not shown but including the storage 2906) implements the hardware description described by the machine-executable code 2908. By way of non-limiting example, the processor(s) 2902 may include a programmable logic device (e.g., an FPGA or a PLC) and the logic circuit 2904 may be electrically controlled to implement circuitry corresponding to the hardware description into the logic circuit 2904. Also, by way of non-limiting example, the logic circuit 2904 may include hard-wired logic manufactured by a manufacturing system (not shown, but including the storage 2906) according to the hardware description of the machine-executable code 2908.

Regardless of whether the machine-executable code 2908 includes computer-readable instructions or a hardware description, the logic circuit 2904 is adapted to perform the functional elements described by the machine-executable code 2908 when implementing the functional elements of the machine-executable code 2908. It is noted that although a hardware description may not directly describe functional elements, a hardware description indirectly describes functional elements that the hardware elements described by the hardware description are capable of performing.

As used in the present disclosure, the terms "module" or "component" may refer to specific hardware implementations to perform the actions of the module or component and/or software objects or software routines that may be stored on and/or executed by general purpose hardware (e.g., computer-readable media, processing devices, without limitation) of the computing system. In some examples, the different components, modules, engines, and services described in the present disclosure may be implemented as objects or processes that execute on the computing system (e.g., as separate threads). While some of the systems and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means "some or a totality." As used herein, the term "each and every" means a "totality."

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, without limitation" or "one or more of A, B, and C, without limitation" is used, in general such a construction is intended to include A alone, B alone, C alone, A and B together, A and C together, B and C together, or A, B, and C together, without limitation.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples include:

Example 1: An apparatus, comprising: a phase detector, wherein a status signal of the phase detector is at least partially based on a phase relationship between a reference clock and a feedback clock, the feedback clock generated by a clock tracking circuit to track the reference clock; a digital discriminator to sample the status signal of the phase detector; and a logic circuit to determine a locked status of the clock tracking circuit at least partially based on samples of the status signal of the phase detector.

Example 2: The apparatus according to Example 1, wherein the phase detector to set the status signal at least partially based on a phase threshold and the phase relationship between the reference clock and the feedback clock.

Example 3: The apparatus according to any of Examples 1 and 2, wherein a value of the phase threshold is settable.

Example 4: The apparatus according to any of Examples 1 through 3, wherein the phase detector to: set the status signal to a first value at least partially responsive to determining that a determined amount of difference is greater than a phase threshold.

Example 5: The apparatus according to any of Examples 1 through 4, wherein the phase detector to: set the status signal of the phase detector to a second value at least partially responsive to determining that a determined amount of difference is equal to or less than a phase threshold, wherein the second value is different than a first value.

Example 6: The apparatus according to any of Examples 1 through 5, wherein, to determine the locked status of the clock tracking circuit, the logic circuit to: decode locked status information from samples of the status signal of a phase detector; and determine the locked status of the clock tracking circuit at least partially based on the decoded locked status information.

Example 7: The apparatus according to any of Examples 1 through 6, wherein the logic circuit to set a locked status signal to a first value to indicate a locked state and set the locked status signal to a second value to indicate a not locked state.

Example 8: The apparatus according to any of Examples 1 through 7, wherein the phase detector to: detect occurrences of like respective edges of the reference clock and the feedback clock; and set the status signal to indicate whether or not the detected occurrences of like respective edges were within a predetermined range.

Example 9: The apparatus according to any of Examples 1 through 8, wherein the phase detector to: set the status signal to a first value responsive to a time difference between the detected occurrences of like respective edges of the reference clock and the feedback clock is less than a phase threshold.

Example 10: The apparatus according to any of Examples 1 through 9, wherein the phase detector to: set the status signal to a second value responsive to a time difference between the detected occurrences of like respective edges of the reference clock and the feedback clock is greater than or equal to a phase threshold.

Example 11: The apparatus according to any of Examples 1 through 10, wherein the digital discriminator includes a decimator to decimate values of the status signal.

Example 12: The apparatus according to any of Examples 1 through 11, wherein the digital discriminator includes an interpolator to interpolate values based on the status signal.

Example 13: The apparatus according to any of Examples 1 through 12, wherein the digital discriminator includes a digital filter to block status signal that is indicative of transient phase error and pass status signal that is indicative of steady-state phase error.

Example 14: A method, comprising: setting a status signal of a phase detector, wherein the status signal of the phase detector is set at least partially based on a phase relationship between a reference clock and a feedback clock generated by a clock tracking circuit to track the reference clock; and generating a signal indicative of a locked status of the clock tracking circuit at least partially based on the status signal of the phase detector.

Example 15: The method according to Example 14, comprising: determining whether or not the phase relationship between the reference clock and feedback clock falls within a predetermined range; and setting the status signal of the phase detector at least partially based on the determination.

Example 16: The method according to any of Examples 14 and 15, comprising: setting the status signal of the phase detector to a first value at least partially responsive to determining that a determined amount of difference is greater than a phase threshold.

Example 17: The method according to any of Examples 14 through 16, comprising: setting the status signal of the phase detector to a second value at least partially responsive to determining that a determined amount of difference is equal to or less than a phase threshold, wherein the second value is different than a first value.

Example 18: The method according to any of Examples 14 through 17, detecting occurrences of like respective edges of the reference clock and the feedback clock; and setting the status signal to indicate whether or not the detected occurrences of like respective edges were within a predetermined range.

Example 19: The method according to any of Examples 14 through 18, wherein setting the status signal to indicate whether or not the detected occurrences of like respective edges were within the predetermined range comprises: setting the status signal to a first value responsive to a time difference between the detected occurrences of like respective edges of the reference clock and the feedback clock is less than a phase threshold.

Example 20: The method according to any of Examples 14 through 19, wherein setting the status signal to indicate whether or not the detected occurrences of like respective edges were within the predetermined range comprises: setting the status signal to a second value responsive to a time difference between the detected occurrences of like respective edges of the reference clock and the feedback clock is greater than or equal to a phase threshold.

Example 21: The method according to any of Examples 14 through 120, obtaining samples of the status signal of the phase detector; decoding locked status information from samples of the status signal of the phase detector; and determining the locked status of the clock tracking circuit at least partially based on the decoded locked status information.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:
a phase detector, wherein a status signal of the phase detector is at least partially based on a phase relationship between a reference clock and a feedback clock, the feedback clock generated by a clock tracking circuit to track the reference clock;
a digital discriminator to sample the status signal of the phase detector; and
a logic circuit to determine a locked status of the clock tracking circuit at least partially based on samples of the status signal of the phase detector.

2. The apparatus of claim 1, wherein the phase detector to set the status signal at least partially based on a phase threshold and the phase relationship between the reference clock and the feedback clock.

3. The apparatus of claim 2, wherein a value of the phase threshold is settable.

4. The apparatus of claim 1, wherein the phase detector to:
set the status signal to a first value at least partially responsive to determining that a determined amount of difference between the reference clock and the feedback clock is greater than a phase threshold.

5. The apparatus of claim 4, wherein the phase detector to:
set the status signal of the phase detector to a second value at least partially responsive to determining that a determined amount of difference between the reference clock and the feedback clock is equal to or less than a phase threshold, wherein the second value is different than a first value.

6. The apparatus of claim 1, wherein, to determine the locked status of the clock tracking circuit, the logic circuit to:
decode locked status information from samples of the status signal of a phase detector; and
determine the locked status of the clock tracking circuit at least partially based on the decoded locked status information.

7. The apparatus of claim 1, wherein the logic circuit to set a locked status signal to a first value to indicate a locked state and set the locked status signal to a second value to indicate a not locked state.

8. The apparatus of claim 1, wherein the phase detector to:
detect occurrences of like respective edges of the reference clock and the feedback clock; and
set the status signal to indicate whether or not the detected occurrences of like respective edges were within a predetermined range.

9. The apparatus of claim 8, wherein the phase detector to:
set the status signal to a first value responsive to a time difference between the detected occurrences of like respective edges of the reference clock and the feedback clock is less than a phase threshold.

10. The apparatus of claim 9, wherein the phase detector to:
set the status signal to a second value responsive to a time difference between the detected occurrences of like respective edges of the reference clock and the feedback clock is greater than or equal to a phase threshold, wherein the second value is different than the first value.

11. The apparatus of claim 1, wherein the digital discriminator includes a decimator to decimate values of the status signal.

12. The apparatus of claim 1, wherein the digital discriminator includes an interpolator to interpolate values based on the status signal.

13. The apparatus of claim 1, wherein the digital discriminator includes a digital filter to block status signal that is indicative of transient phase error and pass status signal that is indicative of steady-state phase error.

14. A method, comprising:
setting a status signal of a phase detector, wherein the status signal of the phase detector is set at least partially based on a phase relationship between a reference clock and a feedback clock generated by a clock tracking circuit to track the reference clock, the phase relationship between the reference clock and the feedback clock being at least partially based on a relationship between a phase threshold and an amount of difference between the reference clock and the feedback clock; and
generating a signal indicative of a locked status of the clock tracking circuit at least partially based on the status signal of the phase detector.

15. The method of claim 14, comprising:
determining whether or not the phase relationship between the reference clock and the feedback clock falls within a predetermined range; and
setting the status signal of the phase detector at least partially based on the determination.

16. The method of claim 14, comprising:
setting the status signal of the phase detector to a value at least partially responsive to determining that a determined amount of difference between the reference clock and the feedback clock is greater than the phase threshold.

17. The method of claim 14, comprising:
setting the status signal of the phase detector to a value at least partially responsive to determining that a determined amount of difference between the reference clock and the feedback clock is equal to or less than the phase threshold.

18. The method of claim 14,
obtaining samples of the status signal of the phase detector;
decoding locked status information from samples of the status signal of the phase detector; and
determining the locked status of the clock tracking circuit at least partially based on the decoded locked status information.

19. A method, comprising:
detecting occurrences of like respective edges of a reference clock and a feedback clock generated by a clock tracking circuit to track the reference clock;
setting a status signal of a phase detector to indicate whether or not the detected occurrences of like respective edges were within a predetermined range; and generating a signal indicative of a locked status of the clock tracking circuit at least partially based on the status signal of the phase detector.

20. The method of claim 19, wherein setting the status signal to indicate whether or not the detected occurrences of like respective edges were within the predetermined range comprises:

setting the status signal to a value responsive to a time difference between the detected occurrences of like respective edges of the reference clock and the feedback clock being less than a phase threshold.

21. The method of claim 19, wherein setting the status signal to indicate whether or not the detected occurrences of like respective edges were within the predetermined range comprises:

setting the status signal to a value responsive to a time difference between the detected occurrences of like respective edges of the reference clock and the feedback clock being greater than or equal to a phase threshold.

* * * * *